(12) United States Patent
Fuse et al.

(10) Patent No.: US 10,879,072 B2
(45) Date of Patent: *Dec. 29, 2020

(54) HEAT TREATMENT METHOD AND HEAT TREATMENT APPARATUS FOR HEATING SUBSTRATE BY IRRADIATING SUBSTRATE WITH LIGHT

(71) Applicant: SCREEN Holdings Co., Ltd., Kyoto (JP)

(72) Inventors: Kazuhiko Fuse, Kyoto (JP); Shinichi Kato, Kyoto (JP); Kenichi Yokouchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,260

(22) Filed: Mar. 11, 2019

(65) Prior Publication Data
US 2019/0206687 A1    Jul. 4, 2019

Related U.S. Application Data

(62) Division of application No. 15/142,830, filed on Apr. 29, 2016, now Pat. No. 10,276,385, which is a
(Continued)

(30) Foreign Application Priority Data

Mar. 23, 2011 (JP) .................................. 2011-063735
Mar. 23, 2011 (JP) .................................. 2011-063736
Dec. 7, 2011 (JP) .................................. 2011-267631

(51) Int. Cl.
*H01L 21/02* (2006.01)
*H01L 21/225* (2006.01)
(Continued)

(52) U.S. Cl.
CPC ...... *H01L 21/2253* (2013.01); *F27B 17/0025* (2013.01); *H01L 21/02694* (2013.01);
(Continued)

(58) Field of Classification Search
CPC ........... H01L 21/02694; H01L 21/2253; H01L 21/26513; H01L 21/2686; H01L 21/324;
(Continued)

(56) References Cited

U.S. PATENT DOCUMENTS 2,963,625 A   12/1960  Smura et al.
4,649,261 A    3/1987  Sheets
(Continued)

FOREIGN PATENT DOCUMENTS

JP    60-258928     12/1985
JP    2004-063863    2/2004
(Continued)

OTHER PUBLICATIONS

Decision to Grant dated Jul. 20, 2017 in corresponding Korean Application KR-10-2014-0030112. An English translation is not prepared as the Notice includes no specific mention on the cited documents.
(Continued)

*Primary Examiner* — Mary A Wilczewski
(74) *Attorney, Agent, or Firm* — Ostrolenk Faber LLP

(57) ABSTRACT

First irradiation which causes an emission output from a flash lamp to reach its maximum value over a time period in the range of 1 to 20 milliseconds is performed to increase the temperature of a front surface of a semiconductor wafer from a preheating temperature to a target temperature for a time period in the range of 1 to 20 milliseconds. This achieves the activation of the impurities. Subsequently, second irradiation which gradually decreases the emission output from the maximum value over a time period in the
(Continued)

range of 3 to 50 milliseconds is performed to maintain the temperature of the front surface within a ±25° C. range around the target temperature for a time period in the range of 3 to 50 milliseconds. This prevents the occurrence of process-induced damage while suppressing the diffusion of the impurities.

11 Claims, 18 Drawing Sheets

Related U.S. Application Data division of application No. 13/417,498, filed on Mar. 12, 2012, now Pat. No. 9,343,313.

(51) Int. Cl.

| | |
|---|---|
| H01L 21/265 | (2006.01) |
| H01L 21/268 | (2006.01) |
| H01L 21/324 | (2006.01) |
| H01L 21/67 | (2006.01) |
| H01L 21/687 | (2006.01) |
| F27B 17/00 | (2006.01) |

(52) U.S. Cl.
CPC .... H01L 21/2686 (2013.01); H01L 21/26513 (2013.01); H01L 21/324 (2013.01); H01L 21/67115 (2013.01); H01L 21/67248 (2013.01); H01L 21/68707 (2013.01); H01L 21/68742 (2013.01)

(58) Field of Classification Search
CPC ......... H01L 21/67115; H01L 21/67248; H01L 21/68707; H01L 21/68742
See application file for complete search history.

(56) References Cited

U.S. PATENT DOCUMENTS

| | | | | |
|---|---|---|---|---|
| 4,829,530 | A | 5/1989 | Sato et al. | |
| 6,066,516 | A | 5/2000 | Miyasaka | |
| 6,436,801 | B1* | 8/2002 | Wilk | H01L 21/28185 438/591 |
| 6,594,446 | B2 | 7/2003 | Camm et al. | |
| 6,849,831 | B2 | 2/2005 | Timans et al. | |
| 7,157,340 | B2 | 1/2007 | Ito et al. | |
| 7,317,870 | B2 | 1/2008 | Timans et al. | |
| 7,442,625 | B2 | 10/2008 | Ito | |
| 7,501,332 | B2 | 3/2009 | Ito et al. | |
| 8,058,134 | B2 | 11/2011 | Wang et al. | |
| 8,145,046 | B2 | 3/2012 | Kiyama | |
| 8,461,033 | B2 | 6/2013 | Kato | |
| 8,559,799 | B2 | 10/2013 | Nishihara | |
| 8,623,750 | B2 | 1/2014 | Fuse | |
| 8,664,116 | B2 | 3/2014 | Fuse et al. | |
| 9,023,740 | B2 | 5/2015 | Kato | |
| 9,343,313 | B2* | 5/2016 | Fuse | H01L 21/26513 |
| 9,633,868 | B2 | 4/2017 | Yokouchi | |
| 10,276,385 | B2* | 4/2019 | Fuse | H01L 21/26513 |
| 2003/0081945 | A1 | 5/2003 | Kusuda | 392/416 |
| 2003/0235972 | A1 | 12/2003 | Hosokawa | |
| 2004/0023472 | A1 | 2/2004 | Niwayama et al. | |
| 2005/0274709 | A1 | 12/2005 | Kusuda | 219/411 |
| 2006/0211225 | A1 | 9/2006 | Kageyama | |
| 2007/0235662 | A1 | 10/2007 | Tien et al. | |
| 2008/0190909 | A1 | 8/2008 | Yokouchi | |
| 2008/0273867 | A1 | 11/2008 | Camm et al. | |
| 2009/0020757 | A1* | 1/2009 | Lo | H01L 21/26506 257/57 |
| 2009/0067823 | A1 | 3/2009 | Kusuda | |
| 2009/0263112 | A1 | 10/2009 | Kiyama et al. | |
| 2009/0285568 | A1 | 11/2009 | Kiyama et al. | |
| 2009/0311840 | A1 | 12/2009 | Onizawa | |
| 2010/0111513 | A1 | 5/2010 | Nishihara | |
| 2010/0178776 | A1 | 7/2010 | Kato | |
| 2010/0210086 | A1 | 8/2010 | Wang et al. | |
| 2010/0258881 | A1* | 10/2010 | Chudzik | H01L 21/28185 257/410 |
| 2011/0274417 | A1 | 11/2011 | Camm et al. | |
| 2012/0008926 | A1 | 1/2012 | Kusuda | |
| 2012/0057855 | A1 | 3/2012 | Yokouchi | |
| 2012/0061374 | A1 | 3/2012 | Yokouchi | |
| 2012/0063751 | A1 | 3/2012 | Yokouchi | |
| 2013/0078786 | A1 | 3/2013 | Fuse | |
| 2013/0078802 | A1 | 3/2013 | Fuse | |
| 2013/0148948 | A1 | 6/2013 | Kato | |
| 2013/0224967 | A1 | 8/2013 | Kusuda | |
| 2013/0337661 | A1 | 12/2013 | Kato | |
| 2014/0162467 | A1 | 6/2014 | Yokouchi | |
| 2014/0212117 | A1 | 7/2014 | Kusuda | |
| 2014/0329340 | A1 | 11/2014 | Yokouchi | |
| 2019/0206687 | A1* | 7/2019 | Fuse | F27B 17/0025 |

FOREIGN PATENT DOCUMENTS

| | | |
|---|---|---|
| JP | 2005-527972 | 9/2005 |
| JP | 2006-261191 | 9/2006 |
| JP | 2008-198674 | 8/2008 |
| JP | 2009-70948 | 4/2009 |
| JP | 2009-260018 | 11/2009 |
| JP | 2009-277759 | 11/2009 |
| JP | 2009-302373 | 12/2009 |
| JP | 2010-525581 | 7/2010 |
| JP | 2010-192692 | 9/2010 |
| JP | 2010-283163 | 12/2010 |
| KR | 10-0347162 | 11/2002 |
| KR | 10-2004-0064207 | 7/2004 |
| KR | 10-0480831 | 4/2005 |
| KR | 10-2009-0027579 | 3/2009 |
| KR | 10-1013234 | 2/2011 |

OTHER PUBLICATIONS

Korean Office Action (KR Application No. 10-2014-0030112) dated Sep. 22, 2016 and its partial English translation.
Office Action issued by Japanese Patent Office dated Sep. 1, 2015 in connection with corresponding Japanese Patent Application No. 2011-267631 and partial English Translation thereof.
Office Action issued by Japanese Patent Office dated Nov. 4, 2014 in connection with corresponding Japanese Patent Application No. 2011-063735 and English Translation thereof.
Office Action issued by Japanese Patent Office dated Nov. 11, 2014 in connection with corresponding Japanese Patent Application No. 2011-063736 and partial English Translation thereof.
Korean Office Action received from the Korean Patent Office dated Dec. 19, 2013 for corresponding Korean application No. 10-2013-0044035.
Japanese translation of Korean Office Action and English translation of Japanese translation of Korean Office Action.
Office Action issued by Taiwanese Patent Office dated Apr. 24, 2014 in connection with corresponding Taiwanese Patent Application No. 101105891 with Japanese and English Translation thereof.
Korean Office Action received from the Korean Patent Office dated Apr. 24, 2014 for corresponding Korean application No. 10-2013-0044035.
Office Action dated Mar. 6, 2013 in corresponding Korean Patent Application No. 10-2012-0019495 with Japanese and English translations.
Korean Office Action received from the Korean Patent Office dated Jun. 5, 2013 for corresponding Korean Application No. 10-2013-0044035.

* cited by examiner

F I G . 6
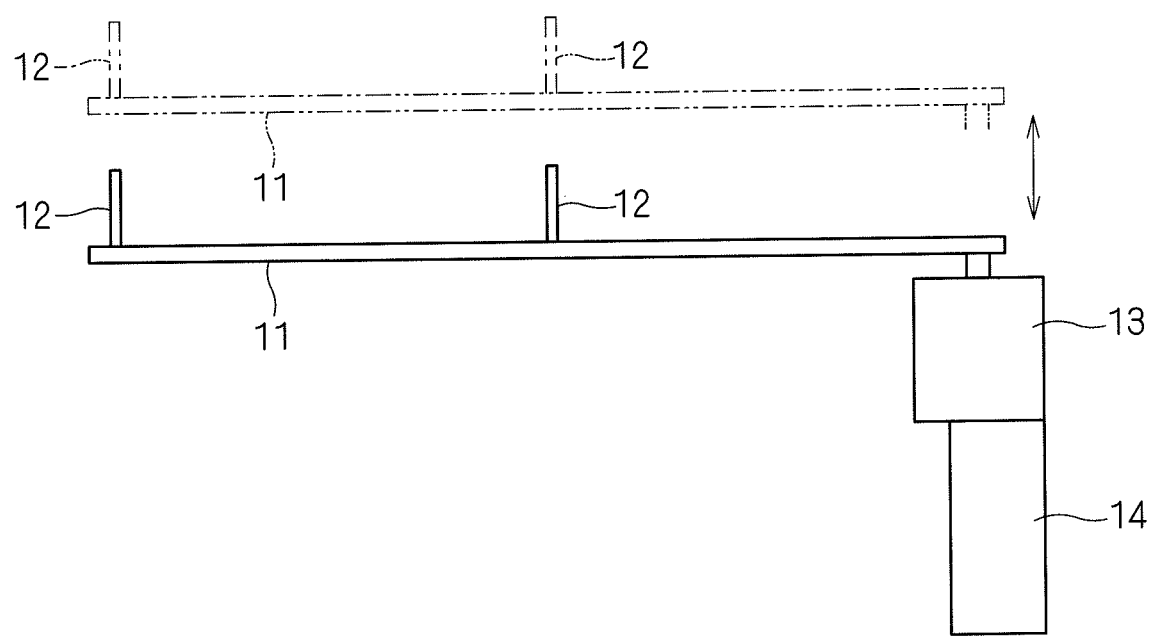

F I G. 9
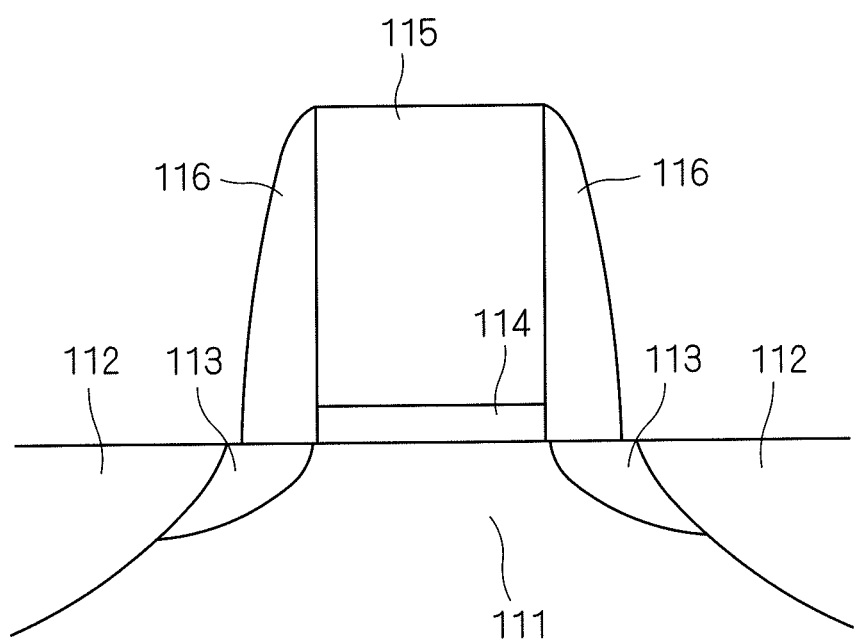

F I G . 1 1
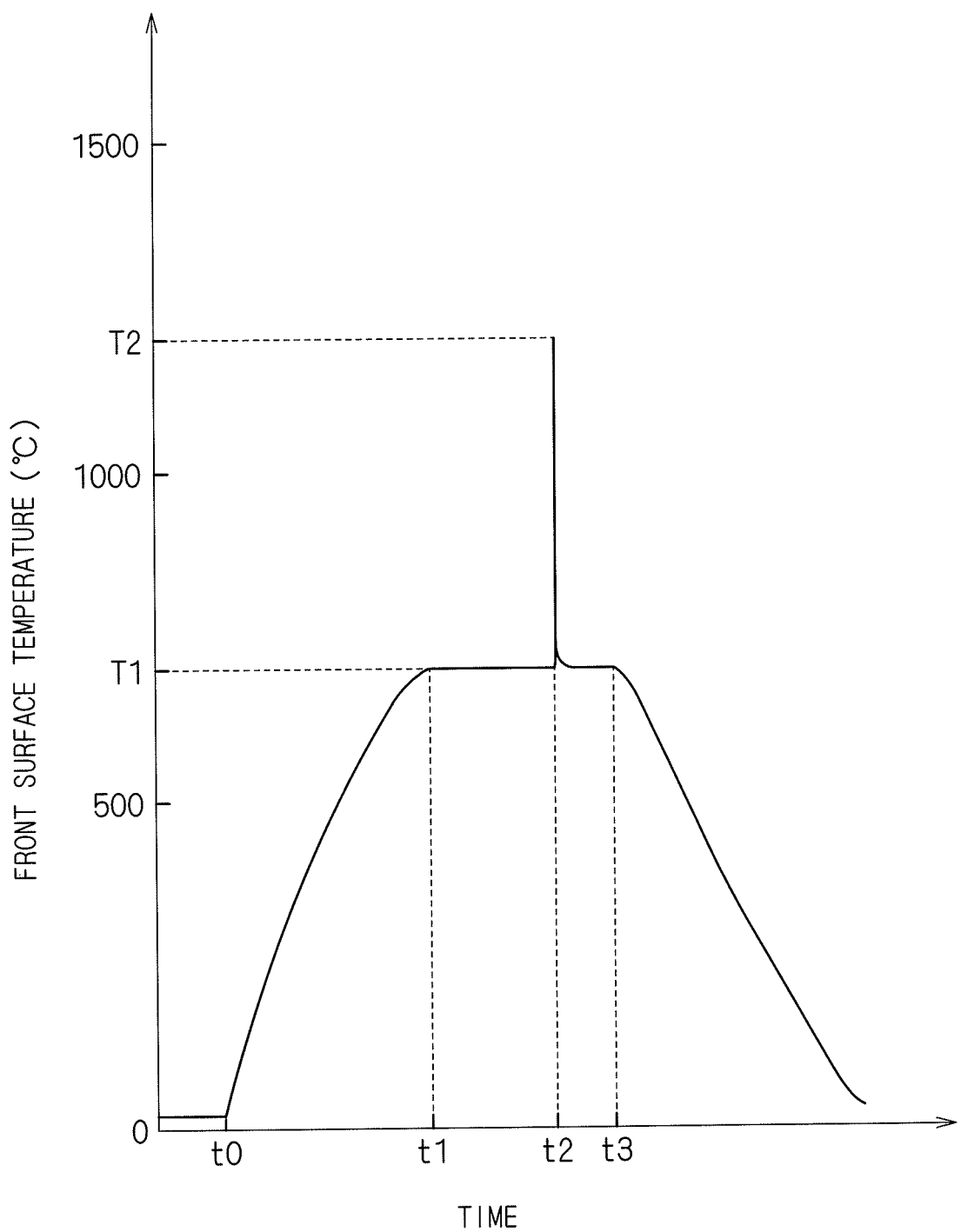

HEAT TREATMENT METHOD AND HEAT TREATMENT APPARATUS FOR HEATING SUBSTRATE BY IRRADIATING SUBSTRATE WITH LIGHT

CROSS-REFERENCE TO RELATED APPLICATIONS

The present application is a divisional of prior U.S. patent application Ser. No. 15/142,830, filed Apr. 29, 2016, by Kazuhiko FUSE, Shinichi KATO and Kenichi YOKOUCHI, entitled "HEAT TREATMENT METHOD AND HEAT TREATMENT APPARATUS FOR HEATING SUBSTRATE BY IRRADIATING SUBSTRATE WITH LIGHT," which is a divisional of U.S. patent application Ser. No. 13/417,498, filed Mar. 12, 2012, now U.S. Pat. No. 9,343,313, issued May 17, 2016, which claims priority to Japanese Patent Application Nos. JP2011-063735, filed Mar. 23, 2011, JP2011-063736, filed Mar. 23, 2011 and JP2011-267631, filed Dec. 7, 2011. The entire contents of each of these patent applications are incorporated herein by reference.

FIELD OF THE INVENTION

The present invention relates to a heat treatment method and a heat treatment apparatus for heating a thin plate-like precision electronic substrate such as a semiconductor wafer and a glass substrate for a liquid crystal display device (hereinafter referred to simply as a "substrate") by irradiating the substrate with light, to thereby activate the impurities.

DESCRIPTION OF THE BACKGROUND ART

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with a flash of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

Heat treatment apparatuses which employ such xenon flash lamps are disclosed in U.S. Pat. Nos. 4,649,261 and 6,849,831 in which pulsed light emitting lamps such as flash lamps are disposed on the front surface side of a semiconductor wafer and lamps that stay lit continuously such as halogen lamps are disposed on the back surface side thereof so that a desired heat treatment is performed using a combination of these lamps. In the heat treatment apparatuses disclosed in U.S. Pat. Nos. 4,649,261 and 6,849,831, a semiconductor wafer is preheated to a certain degree of temperature by the halogen lamps and the like, and is then raised in temperature to a desired treatment temperature by pulse heating from the flash lamps.

However, a heat treatment apparatus employing such a xenon flash lamp, which momentarily irradiates the semiconductor wafer with light having ultrahigh energy, rapidly raises the temperature of the front surface of the semiconductor wafer for a very short period of time. As a result, it has been found that process-induced damage resulting from the abrupt temperature rise occurs to exert an adverse influence on characteristics of the semiconductor device, so that a desired reliability lifetime cannot be obtained.

Also, the implantation of high-energy ions by the ion implantation process results in the induction of a large number of defects in silicon crystals of the semiconductor wafer. Such defects are prone to be induced in positions slightly deeper than an ion-implanted layer. During the annealing process subsequent to the ion implantation, it is desirable to perform the recovery of the induced defects as well as the activation of impurities. For such recovery of the defects, the time for annealing process may be made longer. This, however, presents a problem such that the impurities implanted as mentioned above are diffused more deeply than are required.

To solve such a problem, a flash lamp annealing technique which performs additional irradiation with light with a relatively low emission output after a peak of the emission output is passed is disclosed in U.S. Patent Application Publication No. 2009/0263112. According to the technique disclosed in U.S. Patent Application Publication No. 2009/0263112, the temperature of the front surface of a semiconductor wafer is raised to a treatment temperature, and is thereafter maintained at the treatment temperature for approximately several milliseconds or more by the additional irradiation with light. This allows the heating of the semiconductor wafer in a position slightly deeper than the front surface to some extent, thereby accomplishing not only the activation of the impurities but also the recovery of the induced crystal defects.

In flash lamp annealing, however, when the temperature of the front surface of the semiconductor wafer is raised to the treatment temperature and is thereafter maintained at the treatment temperature, there is a danger that the frequency of occurrence of wafer cracking increases. This is considered to result from the following reason. In the flash lamp annealing in which the front surface of a semiconductor wafer is heated by irradiation for an extremely short time, there inevitably arises a difference in temperature between the front and back surfaces of the semiconductor wafer. Maintaining the temperature of the front surface of the semiconductor wafer at the treatment temperature increases the time period over which there is a large temperature difference between the front and back surfaces, so that stresses resulting from a difference in thermal expansion between the front and back surfaces are concentrated on the back surface of the semiconductor wafer.

SUMMARY OF THE INVENTION

The present invention is intended for a method of heating a substrate by irradiating the substrate with light, to thereby activate the impurities.

According to one aspect of the present invention, the method comprises the steps of: (a) heating a substrate to a predetermined preheating temperature; (b) irradiating the substrate with light to increase the temperature of a front surface of the substrate from the preheating temperature to a target temperature for a time period in the range of 1 to 20 milliseconds; and (c) irradiating the substrate with light to maintain the temperature of the front surface of the substrate within a ±25° C. range around the target temperature for a time period in the range of 3 to 50 milliseconds, the step (c) being performed after the step (b).

The temperature of the front surface of the substrate is maintained near the target temperature for a fixed time period. This prevents the occurrence of process-induced damage while suppressing the diffusion of the impurities in the substrate.

According to another aspect of the present invention, the method comprises the steps of: (a) increasing an emission output from a flash lamp from zero to a first emission output value over a time period in the range of 1 to 20 milliseconds to irradiate a substrate with light; and (b) irradiating the substrate with light while gradually decreasing the emission output from the flash lamp from the first emission output value over a time period in the range of 3 to 50 milliseconds so that the temperature of a front surface of the substrate is maintained within a ±25° C. range around a temperature reached by the front surface of the substrate in the step (a).

The temperature of the front surface of the substrate is maintained near the temperature reached by the front surface of the substrate in the step (a) for a fixed time period. This prevents the occurrence of process-induced damage while suppressing the diffusion of the impurities in the substrate.

According to still another aspect of the present invention, the method comprises the steps of: (a) heating a substrate to a predetermined preheating temperature; (b) irradiating a first surface of the substrate with a flash of light from a flash lamp to increase the temperature of the first surface of the substrate from the preheating temperature to a target temperature over a time period longer than the time required for heat conduction from the first surface to a second surface of the substrate which is a surface opposite from the first surface; and (c) irradiating the first surface of the substrate with a flash of light from the flash lamp to maintain the temperature of the first surface of the substrate within a ±25° C. range around the target temperature for not less than 5 milliseconds, the step (c) being performed after the step (b).

This method produces a relatively small temperature difference between the front and back surfaces of the substrate to thereby prevent the cracking of the substrate. Also, the temperature of the front surface of the substrate is maintained near the target temperature for a fixed time period. This accomplishes both the activation of the impurities in the substrate and the recovery of induced defects.

The present invention is also intended for a heat treatment apparatus for heating a substrate by irradiating the substrate with light, to thereby activate the impurities.

According to one aspect of the present invention, the heat treatment apparatus comprises: a chamber for receiving a substrate therein; a holder for holding the substrate within the chamber; a preheating part for heating the substrate held by the holder to a predetermined preheating temperature; an irradiating part for irradiating the substrate held by the holder with light; and a light emission controller for controlling an emission output from the irradiating part, the light emission controller being configured to control the emission output from the irradiating part so that the irradiating part irradiates the substrate held by the holder with light to increase the temperature of a front surface of the substrate from the preheating temperature to a target temperature for a time period in the range of 1 to 20 milliseconds and thereafter to maintain the temperature of the front surface of the substrate within a ±25° C. range around the target temperature for a time period in the range of 3 to 50 milliseconds.

The temperature of the front surface of the substrate is maintained near the target temperature for a fixed time period. This prevents the occurrence of process-induced damage while suppressing the diffusion of the impurities in the substrate.

According to another aspect of the present invention, the heat treatment apparatus comprises: a chamber for receiving the substrate therein; a holder for holding the substrate within the chamber; a flash lamp for irradiating the substrate held by the holder with light; and a light emission controller for controlling an emission output from the flash lamp, the light emission controller being configured to control the emission output from the flash lamp so that the emission output is increased from zero to a first emission output value over a time period in the range of 1 to 20 milliseconds whereby the substrate is irradiated with light, and thereafter so that the substrate is irradiated with light while the emission output is gradually decreased from the first emission output value over a time period in the range of 3 to 50 milliseconds so that the temperature of a front surface of the substrate is maintained within a ±25° C. range around a temperature reached by the front surface of the substrate subjected to the former irradiation.

The temperature of the front surface of the substrate is maintained near the reached temperature for a fixed time period. This prevents the occurrence of process-induced damage while suppressing the diffusion of the impurities in the substrate.

According to still another aspect of the present invention, the heat treatment apparatus comprises: a chamber for receiving a substrate therein; a holder for holding the substrate within the chamber; a preheating part for heating the substrate held by the holder to a predetermined preheating temperature; a flash lamp for irradiating the substrate held by the holder with a flash of light; and a light emission controller for controlling an emission output from the flash lamp, the light emission controller being configured to control the emission output from the flash lamp so that the flash lamp irradiates a first surface of the substrate held by the holder with a flash of light to increase the temperature of the first surface of the substrate from the preheating temperature to a target temperature over a time period longer than the time required for heat conduction from the first surface to a second surface of the substrate which is a surface opposite from the first surface, and thereafter to maintain the temperature of the first surface of the substrate within a ±25° C. range around the target temperature for not less than 5 milliseconds.

This heat treatment apparatus produces a relatively small temperature difference between the front and back surfaces of the substrate to thereby prevent the cracking of the substrate. Also, the temperature of the front surface of the substrate is maintained near the target temperature for a fixed time period. This accomplishes both the activation of the impurities in the substrate and the recovery of induced defects.

It is therefore an object of the present invention to prevent the occurrence of process-induced damage while suppressing the diffusion of impurities in a substrate.

It is another object of the present invention to accomplish both the activation of impurities in a substrate and the recovery of induced defects while preventing the cracking of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the transfer mechanism;

FIG. 9 is a view showing a structure of an element formed on a semiconductor wafer to be treated in the heat treatment apparatus of FIG. 1;

FIG. 11 is a graph showing an example of changes in the temperature of the front surface of a semiconductor wafer;

DESCRIPTION OF THE PREFERRED EMBODIMENTS

Preferred embodiments according to the present invention will now be described in detail with reference to the drawings.

First Preferred Embodiment

Figure 1:
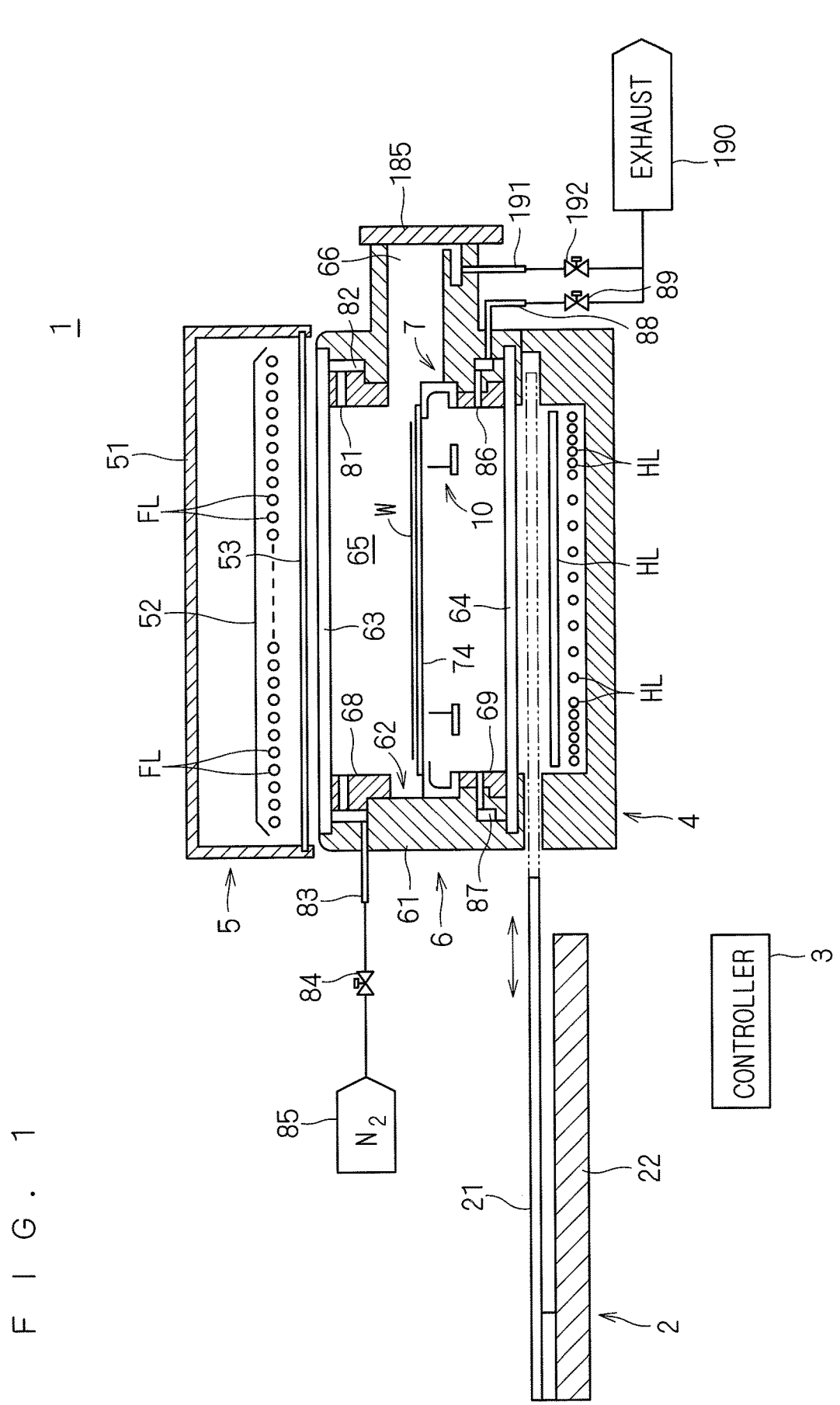
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to a first preferred embodiment of the present invention is a flash lamp annealer for irradiating a disk-shaped silicon semiconductor wafer W having a diameter of 300 mm and serving as a substrate with a flash of light to heat the semiconductor wafer W. A semiconductor wafer W prior to the transport into the heat treatment apparatus 1 is doped with impurities. The heat treatment apparatus 1 performs a heating treatment on the semiconductor wafer W to thereby activate the impurities introduced in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
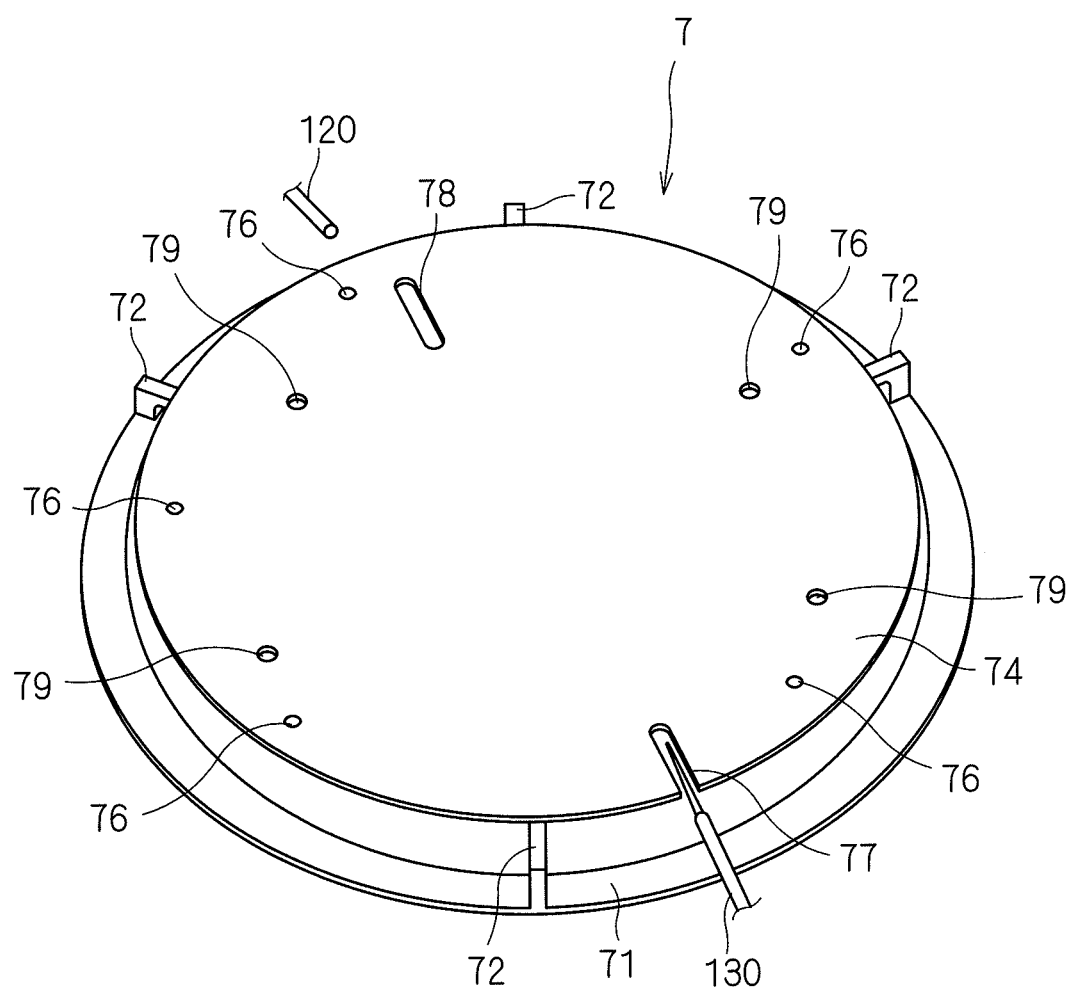
FIG. 2 is a perspective view showing the entire external appearance of a holder.
Figure 3:
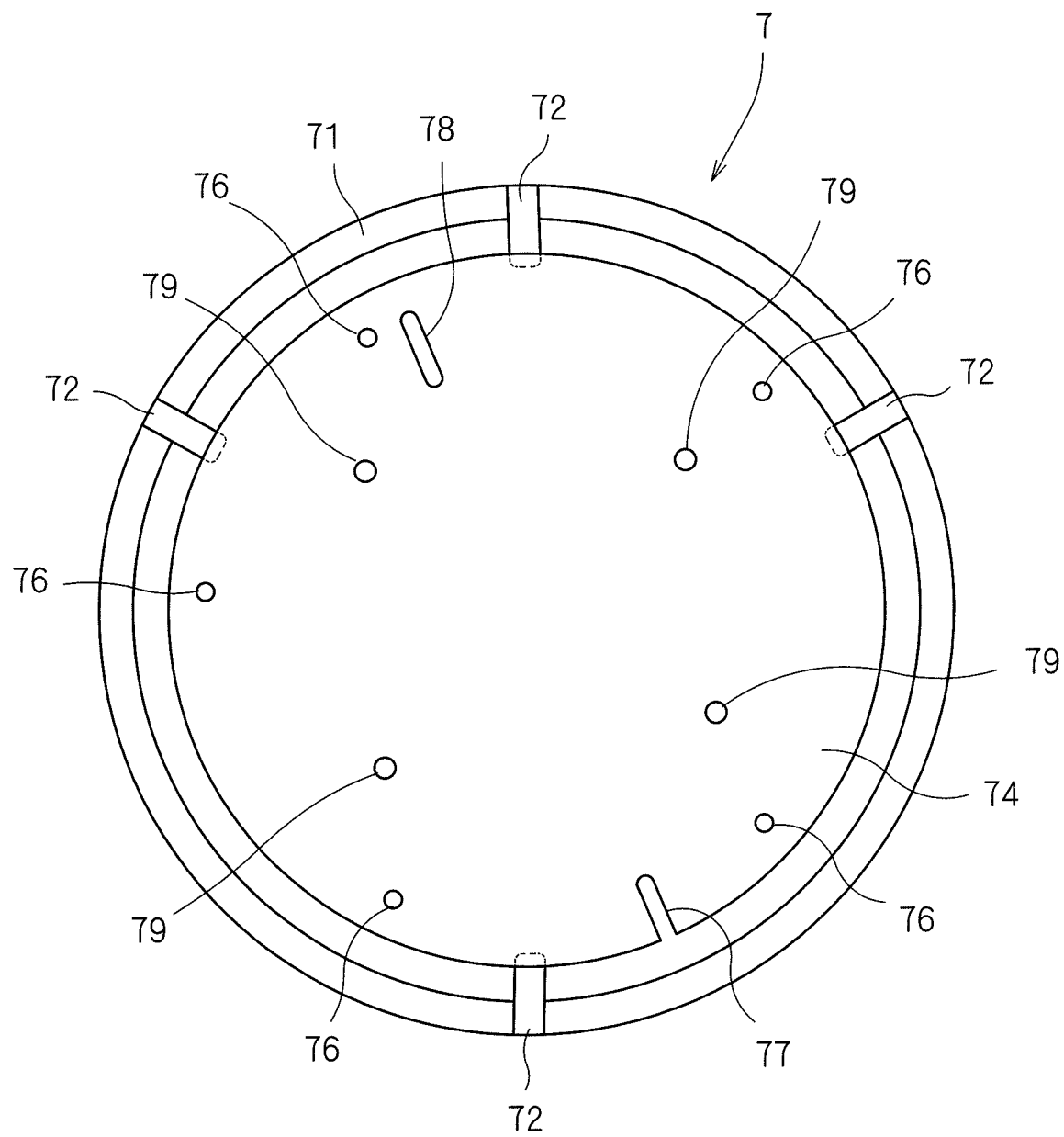
FIG. 3 is a top plan view of the holder.
Figure 4:
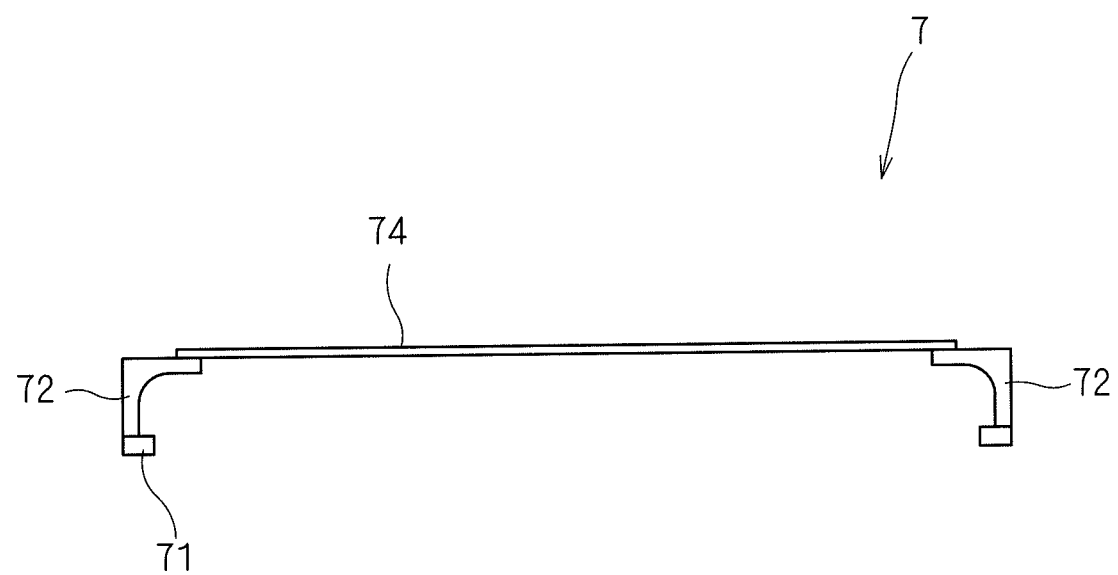
FIG. 4 is a side view of the holder as seen from one side.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The planar susceptor 74 is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in this preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal position (a position such that the normal to the susceptor 74 coincides with a vertical direction). A semiconductor wafer W transported into the chamber 6 is placed and held in a horizontal position on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 5:
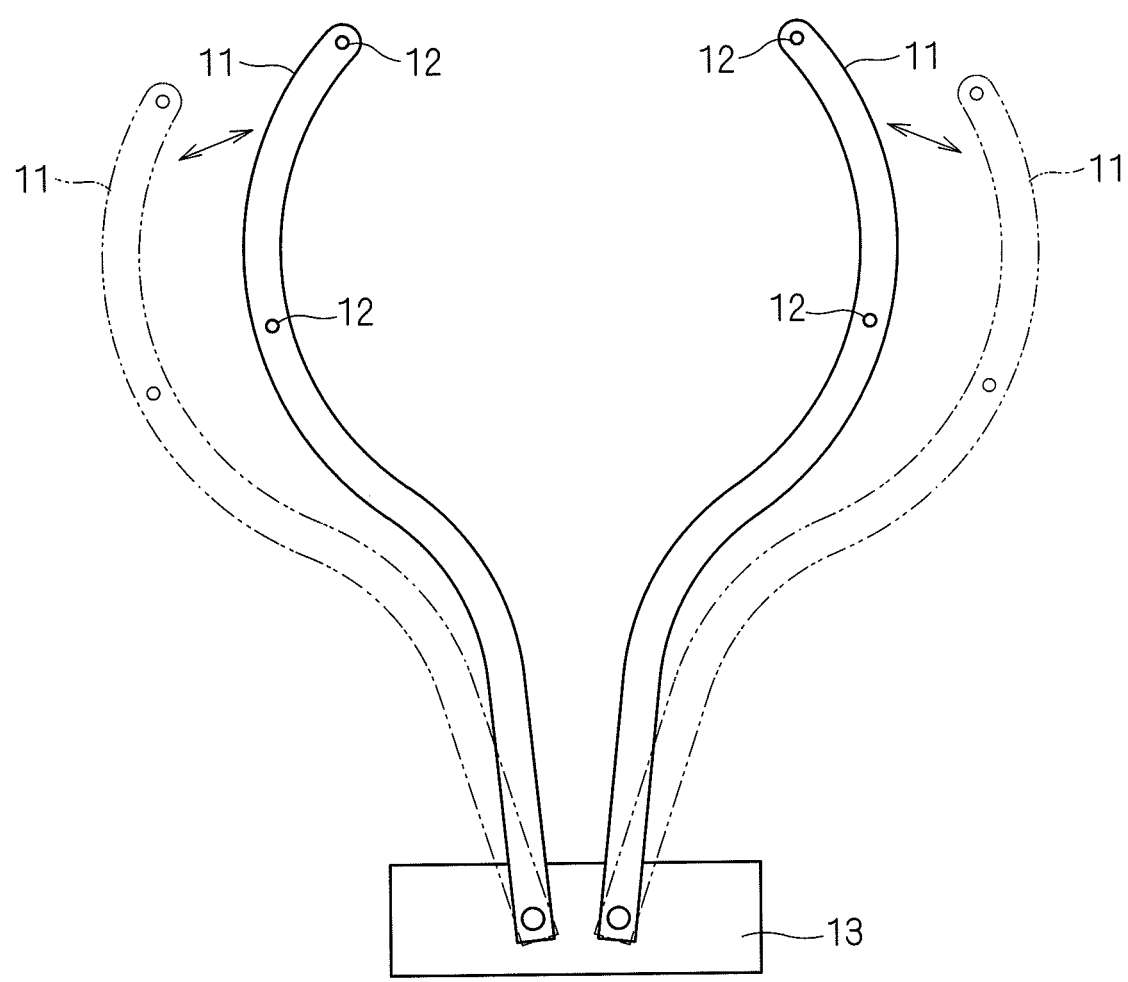
FIG. 5 is a plan view of a transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 8:
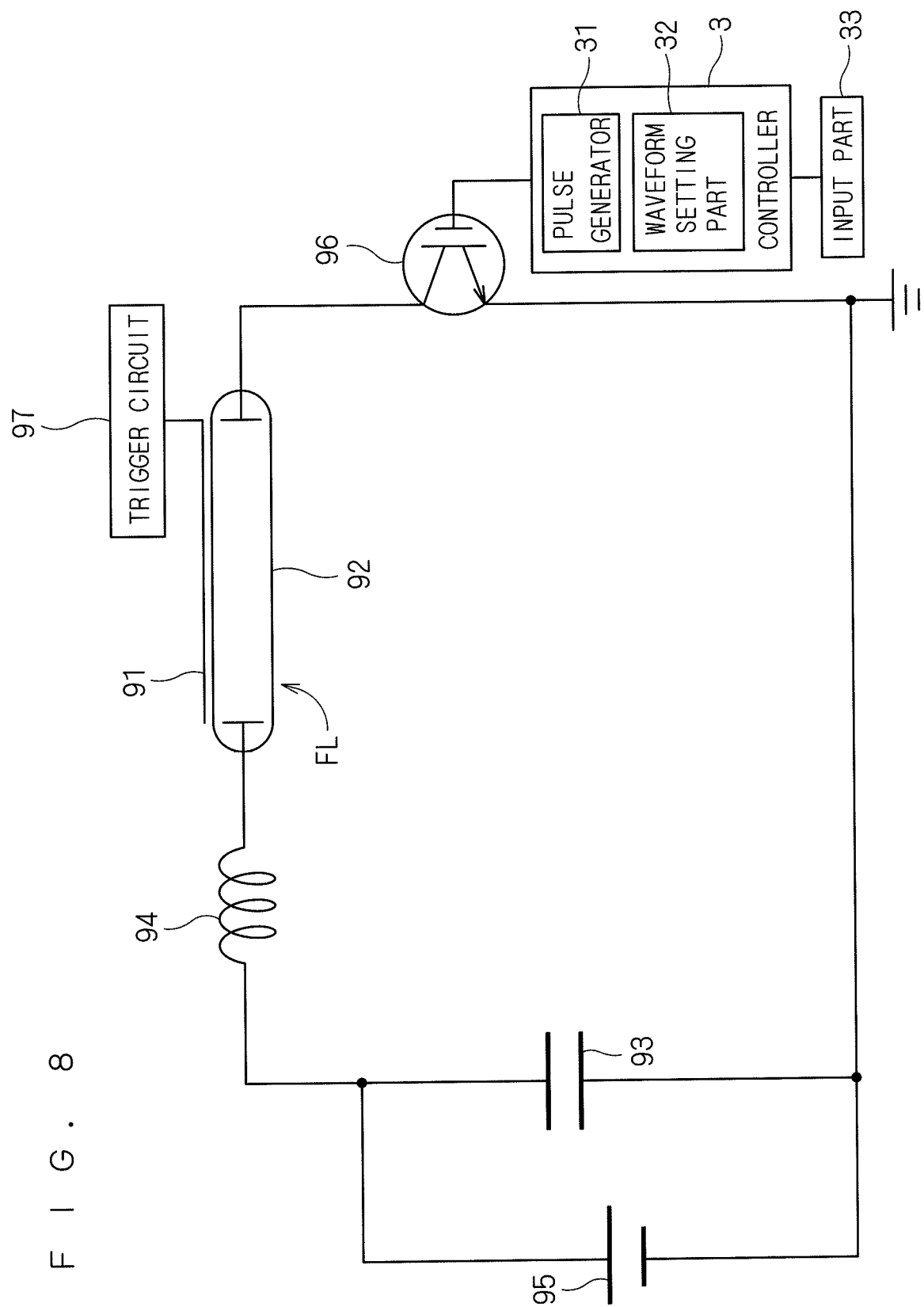
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies the pulse signal to the gate of the IGBT 96. When a voltage ("high" voltage) not less than a predetermined level is applied to the gate of the IGBT 96, the IGBT 96 turns on. When a voltage ("low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon.

Figure 7:
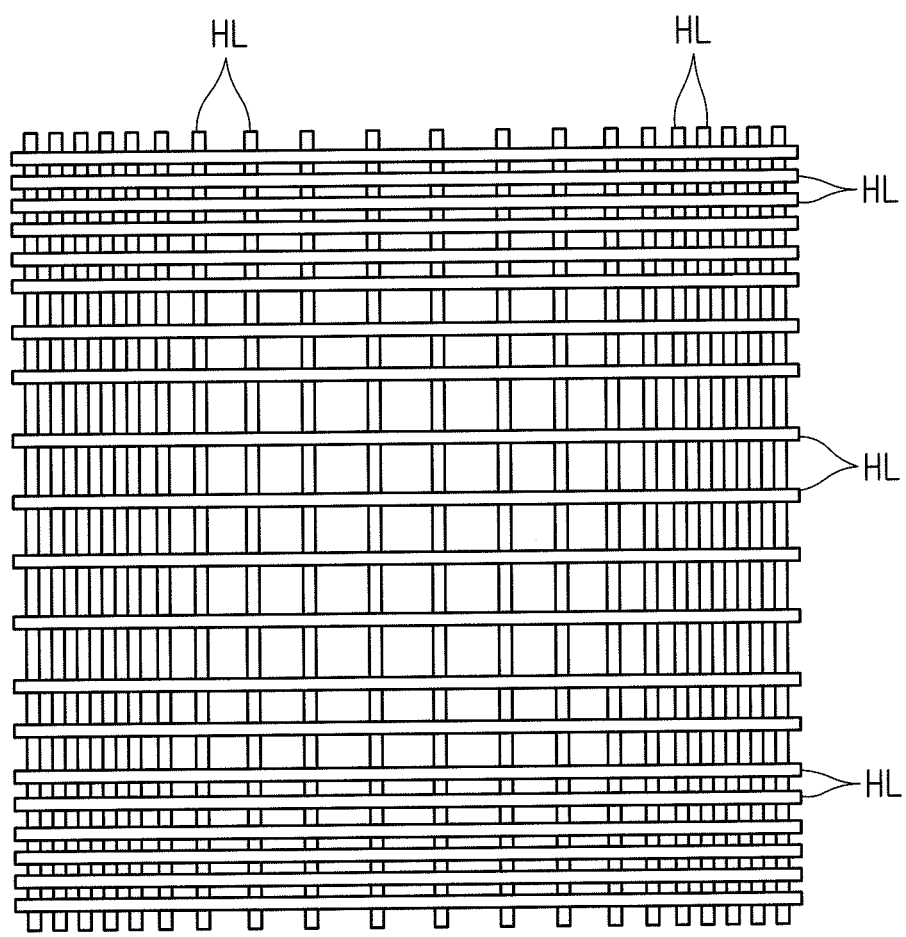
FIG. 7 is a plan view showing an arrangement of halogen lamps.

The multiple (in this preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In this preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform. The controller 3 and the IGBT 96 constitute a light emission controller for controlling an emission output from each flash lamp FL.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. FIG. 9 is a view showing a structure of an element formed on a semiconductor wafer W to be treated in the heat treatment apparatus of FIG. 1. Source/drain regions 112 and extension regions 113 are formed in a silicon substrate 111, and a gate electrode 115 is provided on the upper surface of the silicon substrate 111. The extension regions 113 are electrical connections between the source/drain regions 112 and a channel. The gate electrode 115 made of metal is provided on the silicon substrate 111, with a gate insulation film 114 therebetween. Side walls 116 made of SiN are formed on the sides of the gate electrode 115. The source/drain regions 112 and the extension regions 113 are doped with impurities by an ion implantation process, and the impurities are activated by the heat treatment apparatus 1 performing the process of heating (annealing) by irradiation with light. The procedure for the treatment in the heat treatment apparatus 1 which will be described below proceeds under the control of the controller 3 over the operating mechanisms of the heat treatment apparatus 1.

Figure 10:
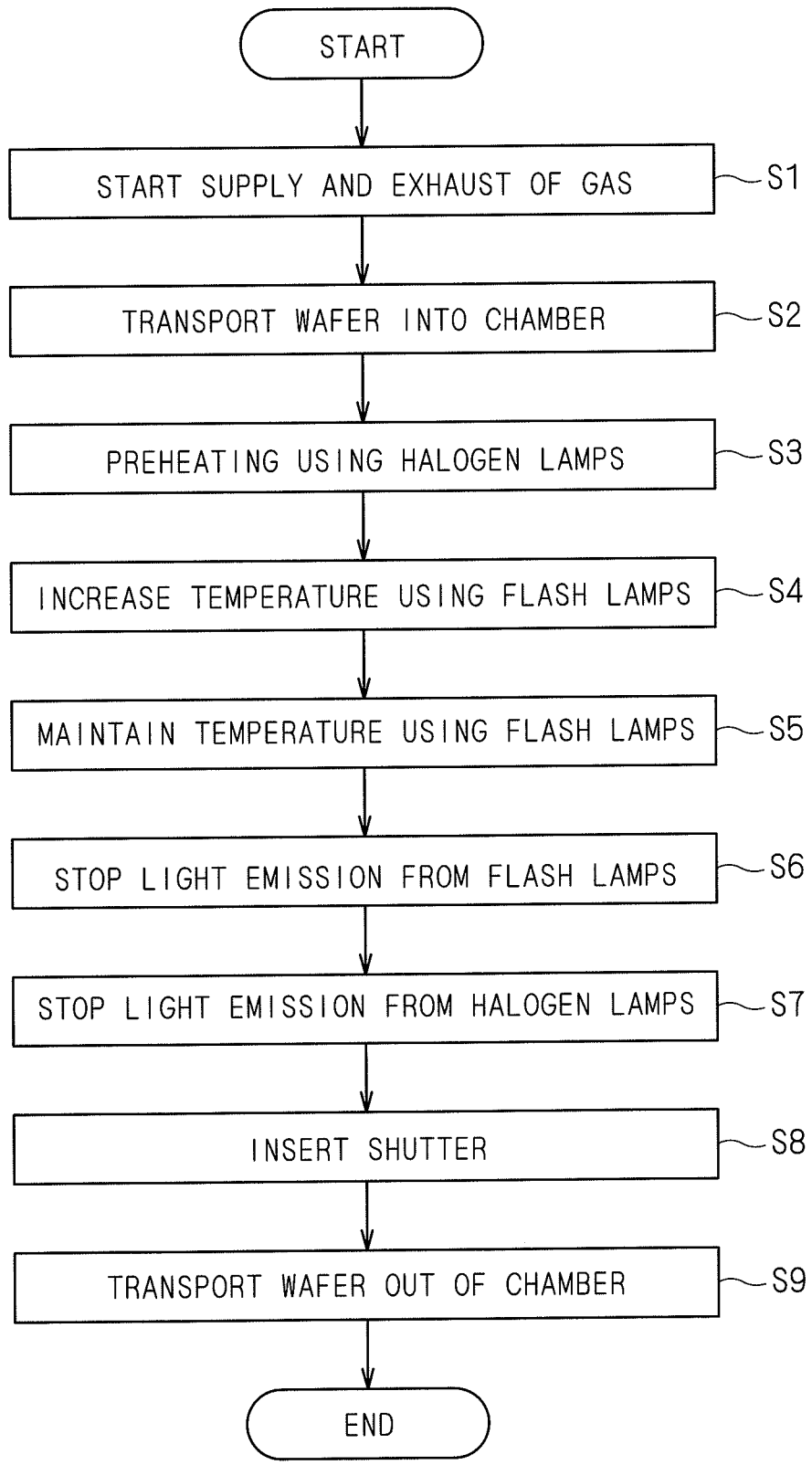
FIG. 10 is a flow diagram showing a procedure for treatment of a semiconductor wafer in the heat treatment apparatus of FIG. 1.

FIG. 10 is a flow diagram showing a procedure for the treatment of a semiconductor wafer W in the heat treatment apparatus 1. First, the valve 84 is opened for supply of gas, and the valves 89 and 192 for exhaust of gas are opened, so that the supply and exhaust of gas into and out of the chamber 6 start (in Step S1). When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with the process steps of FIG. 10.

Subsequently, the gate valve 185 is opened to open the transport opening 66. A transport robot outside the heat treatment apparatus 1 transports a semiconductor wafer W doped with impurities through the transport opening 66 into the heat treatment space 65 in the chamber 6 (in Step S2). The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal position. The semiconductor wafer W is held on the susceptor 74 so that the front surface thereof which is patterned and doped with impurities is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating) (in Step S3). Halogen light emitted from the halogen lamps HL is transmitted through the lower chamber window 64 and the susceptor 74 both made of quartz, and impinges upon the back surface (a main surface opposite from the front surface) of the semiconductor wafer W. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

FIG. 11 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0, so that the temperature of the semiconductor wafer W irradiated with the halogen light is increased to a preheating temperature T1. The preheating temperature T1 is in the range of 300° to 800° C., and shall be 700° C. in the first preferred embodiment.

The temperature of the semiconductor wafer W is measured with the contact-type thermometer 130 when the halogen lamps HL perform preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at time t2 when a predetermined time period has elapsed since the temperature of the semiconductor wafer W reached the preheating temperature T1. It should be noted that a time period required for the temperature of the semiconductor wafer W at room temperature to reach the preheating temperature T1 (a time interval between the time t0 and the time t1) is only on the order of several seconds, and that a time period required between the instant at which the temperature of the semiconductor wafer W reaches the preheating temperature T1 and the instant at which the flash lamps FL emit light (a time interval between the time t1 and the time t2) is also only on the order of several seconds. For flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

Figure 12:
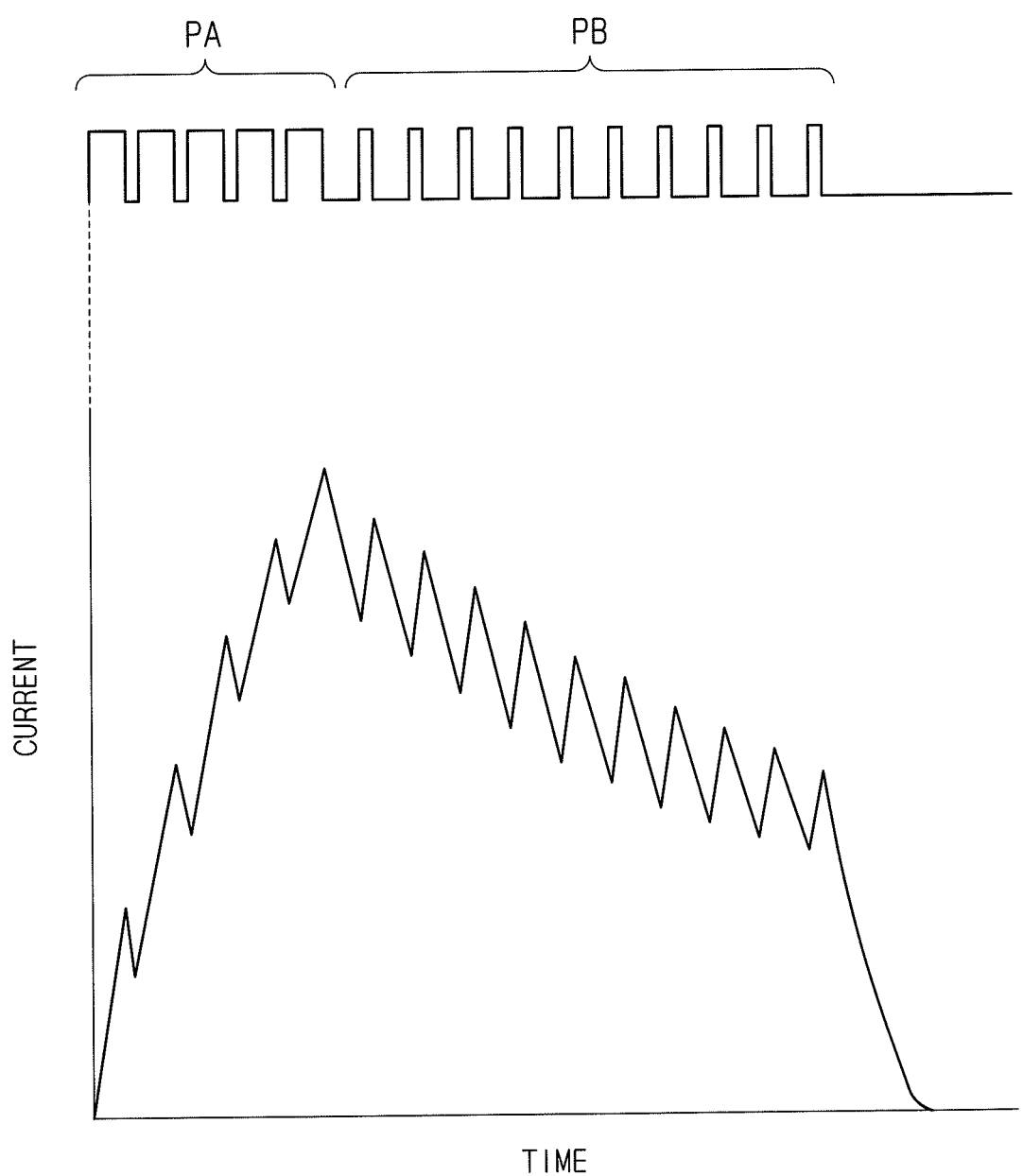
FIG. 12 is a graph showing an example of a correlation between the waveform of a pulse signal and a current flowing through a flash lamp.

FIG. 12 is a graph showing an example of a correlation between the waveform of the pulse signal and a current flowing through a flash lamp FL. In this preferred embodiment, the pulse signal having a waveform as shown in an upper part of FIG. 12 is outputted from the pulse generator 31. The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals as shown in the upper part of FIG. 12 in accordance with the recipe. Pulses PA which are relatively long in pulse width and short in time intervals therebetween are set in an early part of the pulse waveform shown in the upper part of FIG. 12, and pulses PB which are relatively short in pulse width and long in time intervals therebetween are set in a late part thereof. Then, the pulse generator 31 outputs the pulse signal in accordance with the pulse waveform set by the waveform setting part 32. As a result, the pulse signal having the waveform as shown in the upper part of FIG. 12 is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The pulse signal having the waveform shown in the upper part of FIG. 12 is outputted from the controller 3 to the gate of the IGBT 96, and the high voltage is applied to the trigger electrode 91 in synchronism with the turning on of the pulse signal, whereby a current having a waveform as shown in a lower part of FIG. 12 flows through the circuit including the flash lamp FL. Specifically, the value of the current flowing in the glass tube 92 of the flash lamp FL increases when the pulse signal inputted to the gate of the IGBT 96 is on, and decreases when the pulse signal is off. It should be noted that an individual current waveform corresponding to each pulse is defined by the constant of the coil 94.

Figure 13:
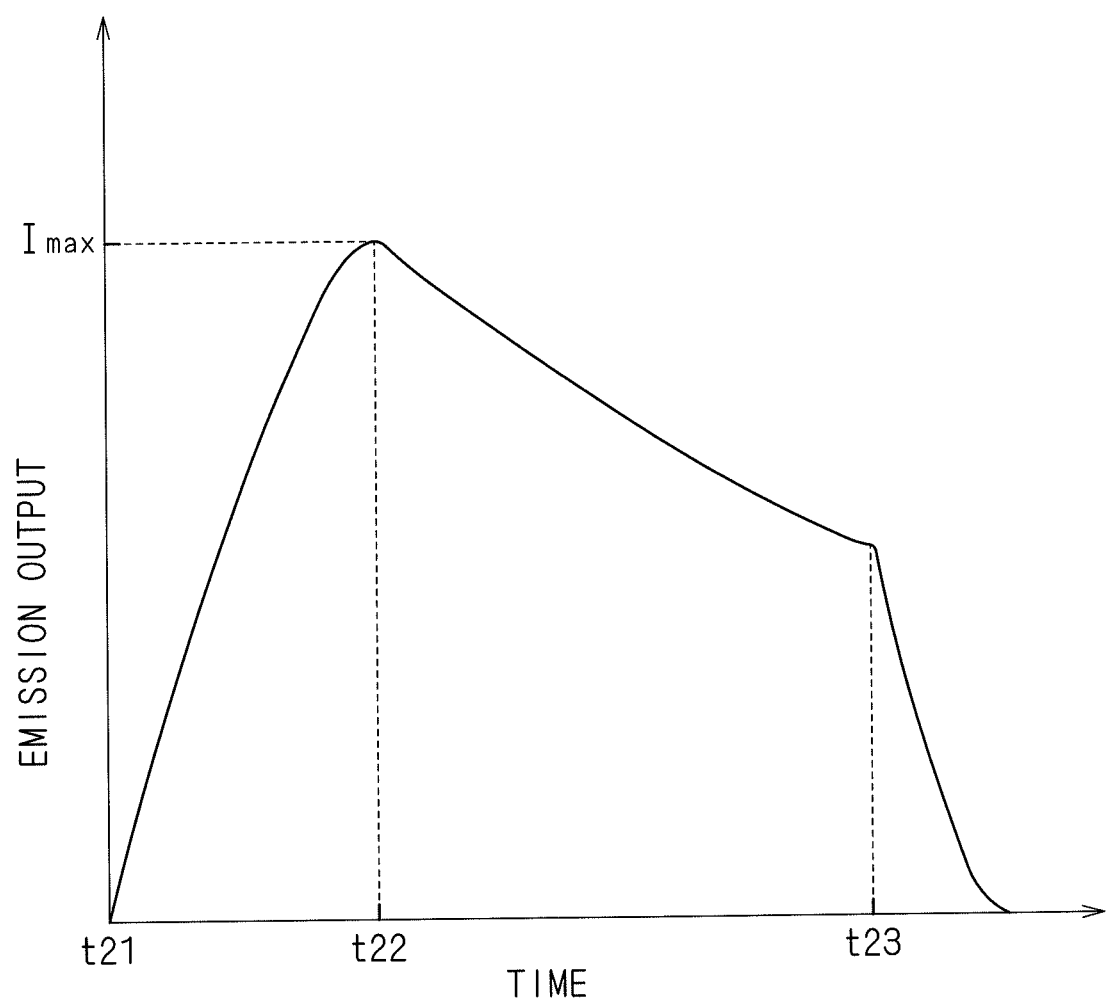
FIG. 13 is a graph showing an example of an emission output profile of a flash lamp.

The current having the waveform shown in the lower part of FIG. 12 flows, so that the flash lamp FL emits light. The emission output from the flash lamp FL is roughly proportional to the current flowing through the flash lamp FL. Thus, the output waveform (profile) of the emission output from the flash lamp FL has a pattern as shown in FIG. 13. The semiconductor wafer W held by the holder 7 is irradiated with light in accordance with the output waveform from the flash lamp FL as shown in FIG. 13.

If the flash lamp FL emits light without using the IGBT 96, the electrical charges stored in the capacitor 93 are consumed momentarily by emitting light only once, so that the output waveform from the flash lamp FL exhibits a single pulse having a width on the order of 0.1 to 10 milliseconds. On the other hand, the IGBT 96 serving as a switching element is connected in the circuit and the pulse signal as shown in the upper part of FIG. 12 is outputted to the gate of the IGBT 96 according to the present preferred embodiment. Thus, the IGBT 96 intermittently supplies the electrical charges from the capacitor 93 to the flash lamp FL to control the current flowing to the flash lamp FL, thereby controlling the emission output from the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current reaches exactly zero, the next pulse is applied to the gate of the IGBT 96 to increase the current value again, as shown in FIG. 12. For this reason, the emission output never reaches exactly zero even while the flash lamp FL repeatedly flashes on and off.

The output waveform of light shown in FIG. 13 may be regarded to show that two-stage irradiation with light is performed. Specifically, the two-stage irradiation includes a first stage of irradiation (first irradiation) from time t21 at which the flash lamp FL starts emitting light to time t22 at which the emission output is at its maximum, and a second stage of irradiation (second irradiation) from the time t22 to time t23 during which the emission output decreases gradually.

More specifically, the pulse generator 31 first intermittently applies the pulses PA which are relatively long in pulse width and short in time intervals therebetween to the gate of the IGBT 96 to cause the IGBT 96 to repeatedly turn on and off, whereby a current flows through the circuit including the flash lamp FL. At this stage, because the pulses PA which are relatively long in pulse width and short in time intervals therebetween are applied to the gate of the IGBT 96, the ON time of the IGBT 96 is longer than the OFF time thereof, so that the current flowing through the flash lamp FL has a sawtooth waveform which increases from zero to a predetermined value as seen in general view (as shown in an early part of the lower part of FIG. 12). The flash lamp FL through which the current having such a waveform flows performs the first irradiation such that the emission output increases from zero to a maximum value $I_{max}$ from the time t21 to the time t22. A time period from the time t21 to the time t22 during which the first step of irradiation is performed is in the range of 1 to 20 milliseconds.

Next, the pulse generator 31 intermittently applies the pulses PB which are relatively short in pulse width and long in time intervals therebetween to the gate of the IGBT 96. At this stage, because the pulses PB which are relatively short in pulse width and long in time intervals therebetween are applied to the gate of the IGBT 96, the ON time of the IGBT 96 is shorter than the OFF time thereof in a manner contrary to the above, so that the current flowing through the flash lamp FL has a sawtooth waveform which decreases gradually from the aforementioned predetermined value as seen in general view (as shown in a late part of the lower part of FIG. 12). The flash lamp FL through which the current having such a waveform flows performs the second irradiation such that the emission output decreases gradually from the maximum value $I_{max}$ from the time t22 to the time t23. A time period from the time t22 to the time t23 during which the second step of irradiation is performed is in the range of 3 to 50 milliseconds.

Figure 14:
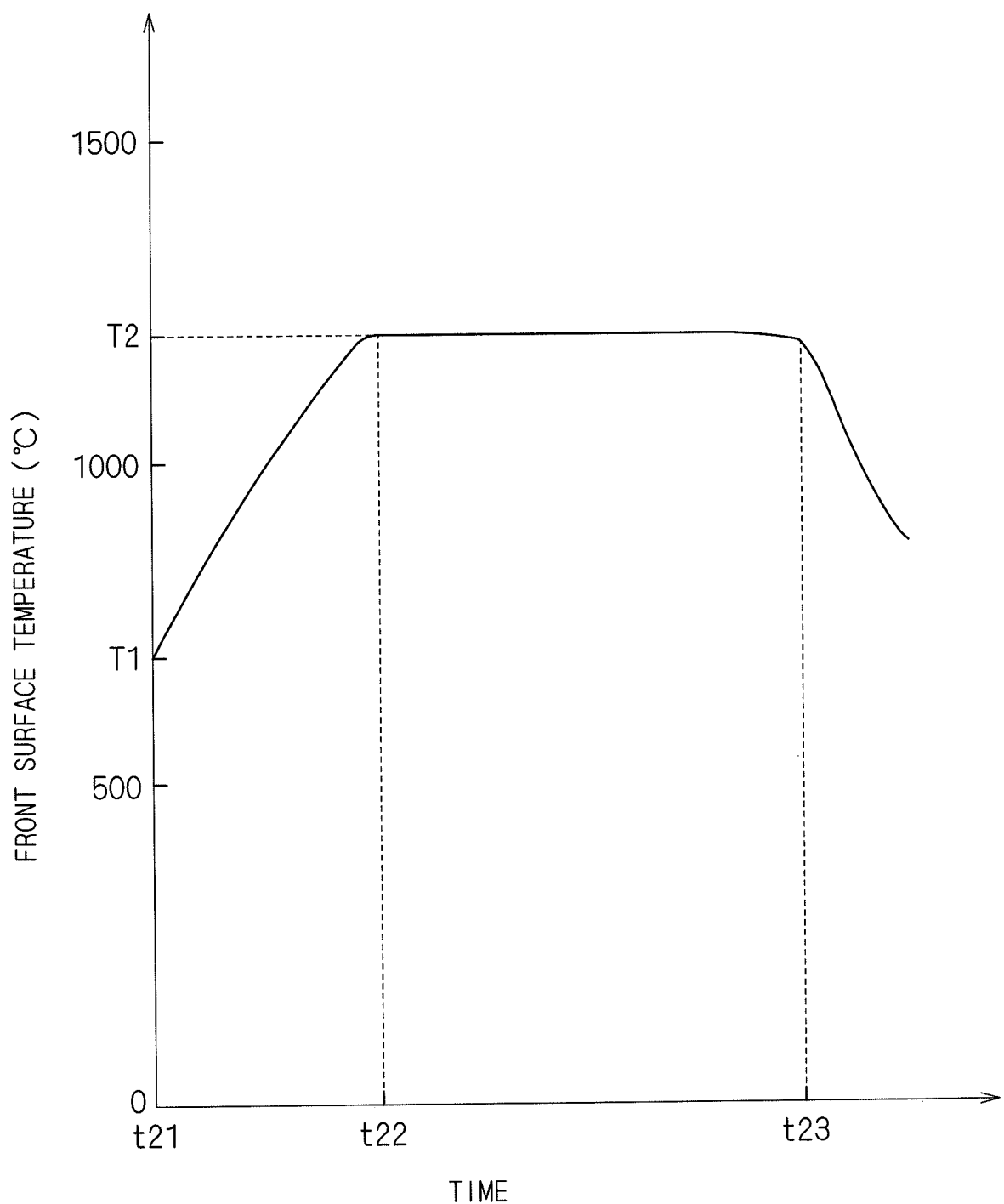
FIG. 14 is a graph showing an example of a temperature profile of the front surface of a semiconductor wafer.

By performing the two-stage irradiation with light as shown in FIG. 13 on the semiconductor wafer W, the temperature of the front surface of the semiconductor wafer W increases from the preheating temperature T1 to a target temperature T2, and the temperature profile thereof has a pattern as shown in FIG. 14. More specifically, the first irradiation performed over the time period in the range of 1 to 20 milliseconds from the time t21 to the time t22 causes the temperature of the front surface of the semiconductor wafer W to increase from the preheating temperature T1 to the target temperature T2 (in Step S4). The target temperature T2 is in the range of 1000° to 1400° C. where the activation of the implanted impurities is achieved, and shall be 1200° C. in the first preferred embodiment.

The second irradiation performed over the time period in the range of 3 to 50 milliseconds from the time t22 to the time t23 maintains the temperature of the front surface of the semiconductor wafer W within a ±25° C. range around the target temperature T2 (in Step S5). It should be noted that the graph of FIG. 11 is plotted with a time scale of seconds, whereas the graph of FIG. 14 is plotted with a time scale of milliseconds. Thus, the times t21 to t23 in FIG. 14 are shown as overlaid on the time t2 in FIG. 11.

After the second irradiation using the flash lamp FL is completed, the IGBT 96 turns off to stop the light emission from the flash lamp FL (in Step S6). Then, the temperature of the front surface of the semiconductor wafer W decreases rapidly from the target temperature T2. Referring again to FIG. 11, the halogen lamps HL turn off at time t3 which is a predetermined time period later than the completion of the second irradiation (in Step S7). This causes the temperature of the semiconductor wafer W to start decreasing from the preheating temperature T1. At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the opening 78 of the susceptor 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held by the susceptor 74 without being influenced by disturbance light.

The controller 3 monitors whether the temperature of the semiconductor wafer W measured with the radiation thermometer 120 decreases to a predetermined temperature or not. After the temperature of the semiconductor wafer W decreases to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

In the first preferred embodiment, the pulses PA which are relatively long in pulse width and short in time intervals therebetween are intermittently applied to the gate of the IGBT 96 to increase the emission output from the flash lamp FL from zero to the maximum value $I_{max}$ over the time period in the range of 1 to 20 milliseconds, thereby accomplishing the first irradiation for irradiating the semiconductor wafer W with light. Such first irradiation causes the temperature of the front surface of the semiconductor wafer W to increase from the preheating temperature T1 to the target temperature T2 over the time period in the range of 1 to 20 milliseconds (in this preferred embodiment, to increase by 500° C.).

The time required for the activation of the implanted impurities is extremely short, and the activation of the impurities is achieved by increasing the temperature of the front surface of the semiconductor wafer W to the target temperature T2. Also, the increase in the temperature of the front surface of the semiconductor wafer W from the preheating temperature T1 to the target temperature T2 over a time period not less than one millisecond prevents the occurrence of process-induced damage to a device formed on the front surface of the semiconductor wafer W and the like. If the time period for the first irradiation during which the emission output from the flash lamp FL increases from zero to the maximum value $I_{max}$ is less than one millisecond, the time required for the temperature to increase from the preheating temperature T1 to the target temperature T2 is also less than one millisecond, which might result in the occurrence of process-induced damage. If the time period for the first irradiation is greater than 20 milliseconds, on the other hand, the time required for the temperature to increase from the preheating temperature T1 to the target temperature T2 becomes accordingly long, which might result in the deep diffusion of the implanted impurities in the stage of the temperature increase to the target temperature T2. For these reasons, the time period for the first irradiation during which the emission output from the flash lamp FL increases from zero to the maximum value $I_{max}$ to increase the temperature of the front surface of the semiconductor wafer W from the preheating temperature T1 to the target temperature T2 shall be in the range of 1 to 20 milliseconds. It should be noted that the time period for the first irradiation is preferably not less than three milliseconds from the viewpoint of preventing process-induced damage with reliability.

Next, after the temperature of the front surface of the semiconductor wafer W is increased from the preheating temperature T1 to the target temperature T2, the pulses PB which are relatively short in pulse width and long in time intervals therebetween are intermittently applied to the gate of the IGBT 96 to accomplish the second irradiation for irradiating the semiconductor wafer W with light while decreasing the emission output from the flash lamp FL gradually from the maximum value $I_{max}$ over the time period in the range of 3 to 50 milliseconds. Such second irradiation maintains the temperature of the front surface of the semiconductor wafer W within a ±25° C. range around the target temperature T2 over the time period in the range of 3 to 50 milliseconds. In the second stage of irradiation, specifically, the semiconductor wafer W is irradiated with light while the emission output from the flash lamp FL is decreased gradually from the maximum value $I_{max}$ over the time period in the range of 3 to 50 milliseconds so that the temperature of the front surface of the semiconductor wafer W is maintained within a ±25° C. range around the target temperature T2 reached by the front surface of the semiconductor wafer W subjected to the first irradiation.

Recovery of point defects induced in the semiconductor wafer W during the implantation of the impurities is achieved by maintaining the temperature of the front surface of the semiconductor wafer W near the target temperature T2 for not less than three milliseconds. Also, because the temperature of the front surface of the semiconductor wafer W is maintained near the target temperature T2 for not less than three milliseconds, damage recovery is achieved if some process-induced damage occurs during the temperature increase from the preheating temperature T1 to the target temperature T2. Further, characteristics of the device formed on the front surface of the semiconductor wafer W and the like are enhanced while the occurrence of the process-induced damage is prevented in the temperature maintaining step. If the time period for the second irradiation during which the emission output from the flash lamp FL is decreased gradually from the maximum value $I_{max}$ is less than three milliseconds, the time for which the temperature of the front surface of the semiconductor wafer W is maintained within a ±25° C. range around the target temperature T2 is also less than three milliseconds, which might result in the occurrence of process-induced damage. If the time period for the second irradiation is greater than 50 milliseconds, on the other hand, the time for which the temperature of the front surface of the semiconductor wafer W is maintained near the target temperature T2 becomes as long as greater than 50 milliseconds, which might result in the deep diffusion of the implanted impurities. For these reasons, the time period for the second irradiation during which the emission output from the flash lamp FL is decreased gradually from the maximum value $I_{max}$ to maintain the temperature of the front surface of the semiconductor wafer W within a ±25° C. range around the target temperature T2 shall be in the range of 3 to 50 milliseconds.

The provision of the temperature maintaining step for maintaining the temperature of the front surface of the semiconductor wafer W within a ±25° C. range around the target temperature T2 over the time period in the range of 3 to 50 milliseconds facilitates a simulation of heat conduction in the semiconductor wafer W and the like, as compared with an instance where the temperature of the front surface decreases immediately after the target temperature T2 is reached so that the impurities are activated. As a result, phenomena resulting from the heating treatment are precisely analyzed.

Second Preferred Embodiment

Next, a second preferred embodiment according to the present invention will be described. The heat treatment apparatus according to the second preferred embodiment is precisely identical in configuration with that according to the first preferred embodiment. The procedure for the treatment of a semiconductor wafer W in the heat treatment apparatus according to the second preferred embodiment is also similar to that according to the first preferred embodiment. The second preferred embodiment differs from the first preferred embodiment in the output waveform of the emission output from the flash lamp FL and, accordingly, in changes in the temperature of the semiconductor wafer W.

Figure 15:
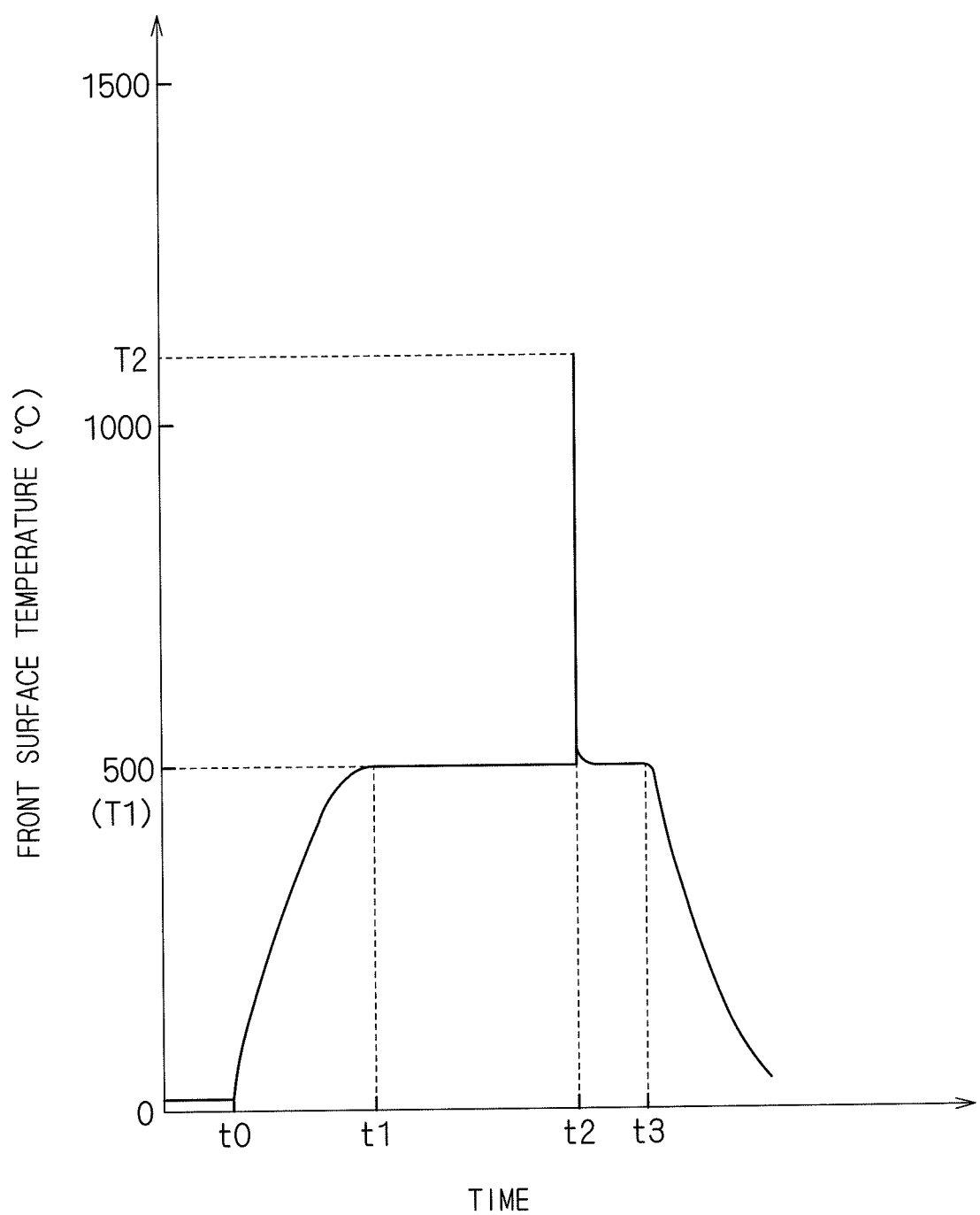
FIG. 15 is a graph showing another example of the changes in the temperature of the front surface of the semiconductor wafer.

FIG. 15 is a graph showing changes in the temperature of the front surface of the semiconductor wafer W according to the second preferred embodiment. After the semiconductor wafer W is transported into the heat treatment space 65 and is placed on the susceptor 74, the controller 3 turns on the 40 halogen lamps HL at the time t0, so that the temperature of the semiconductor wafer W irradiated with the halogen light is increased to the preheating temperature T1. The preheating temperature T1 is in the range of 300° to 800° C., and shall be 500° C. in the second preferred embodiment.

The temperature of the semiconductor wafer W is measured with the contact-type thermometer 130 when the halogen lamps HL perform preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at the time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as the mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at the time t2 when a predetermined time period has elapsed since the temperature of the semiconductor wafer W reached the preheating temperature T1. It should be noted that the time period required for the temperature of the semiconductor wafer W at room temperature to reach the preheating temperature T1 (the time interval between the time t0 and the time t1) is only on the order of several seconds, and that the time period required between the instant at which the temperature of the semiconductor wafer W reaches the preheating temperature T1 and the instant at which the flash lamps FL emit light (the time interval between the time t1 and the time t2) is also only on the order of several seconds. For the flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

Figure 16:
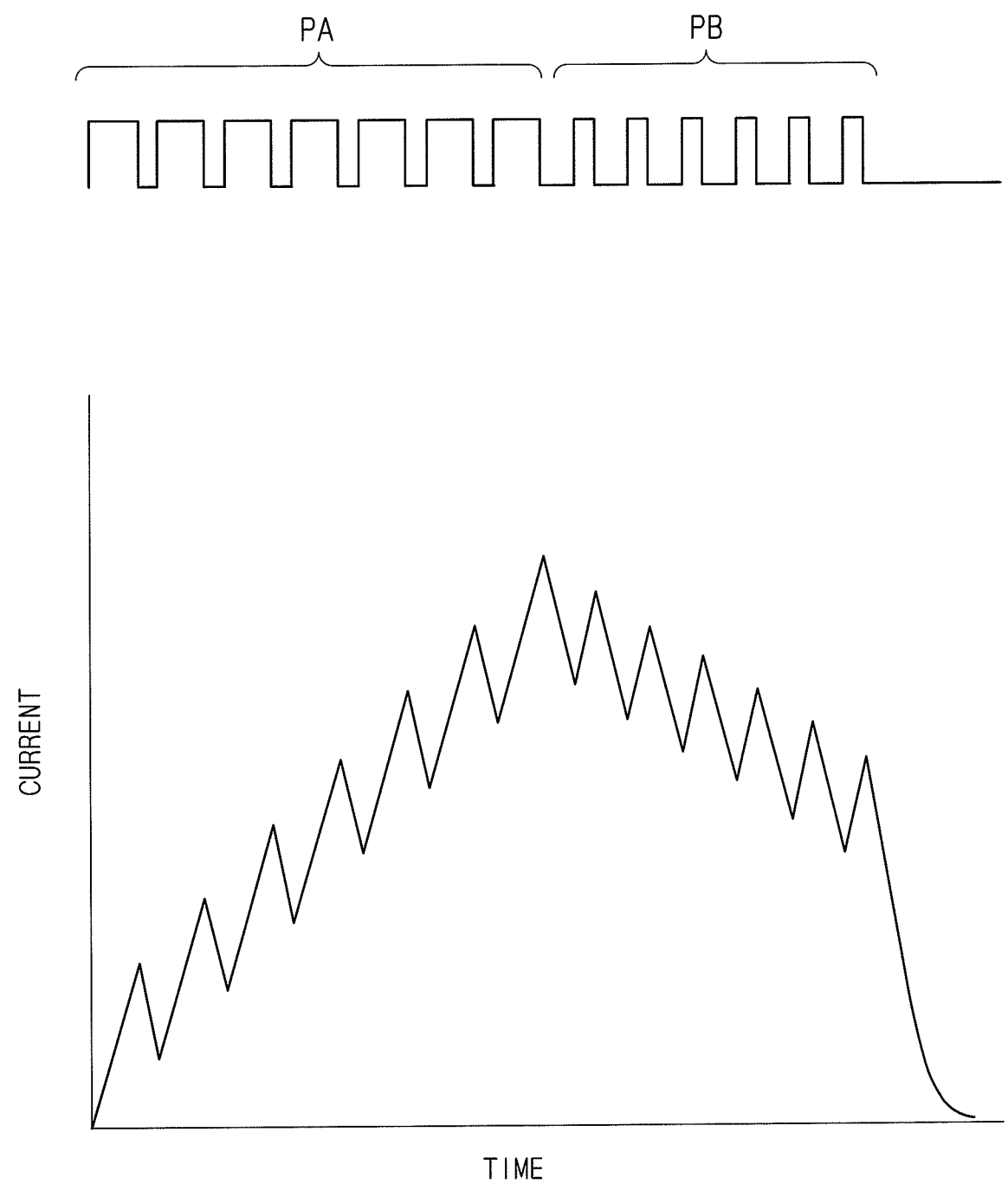
FIG. 16 is a graph showing another example of the correlation between the waveform of the pulse signal and the current flowing through the flash lamp.

FIG. 16 is a graph showing another example of the correlation between the waveform of the pulse signal and the current flowing through the flash lamp FL. In this preferred embodiment, the pulse signal having a waveform as shown in an upper part of FIG. 16 is outputted from the pulse generator 31. The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals as shown in the upper part of FIG. 16 in accordance with the recipe. The pulses PA which are relatively long in pulse width and short in time intervals therebetween are set in an early part of the pulse waveform shown in the upper part of FIG. 16, and the pulses PB which are relatively short in pulse width and long in time intervals therebetween are set in a late part thereof. Then, the pulse generator 31 outputs the pulse signal in accordance with the pulse waveform set by the waveform setting part 32. As a result, the pulse signal having the waveform as shown in the upper part of FIG. 16 is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The pulse signal having the waveform shown in the upper part of FIG. 16 is outputted from the controller 3 to the gate of the IGBT 96, and the high voltage is applied to the trigger electrode 91 in synchronism with the turning on of the pulse signal, whereby a current having a waveform as shown in a lower part of FIG. 16 flows through the circuit including the flash lamp FL. Specifically, the value of the current flowing in the glass tube 92 of the flash lamp FL increases when the pulse signal inputted to the gate of the IGBT 96 is on, and decreases when the pulse signal is off. It should be noted that an individual current waveform corresponding to each pulse is defined by the constant of the coil 94.

Figure 17:
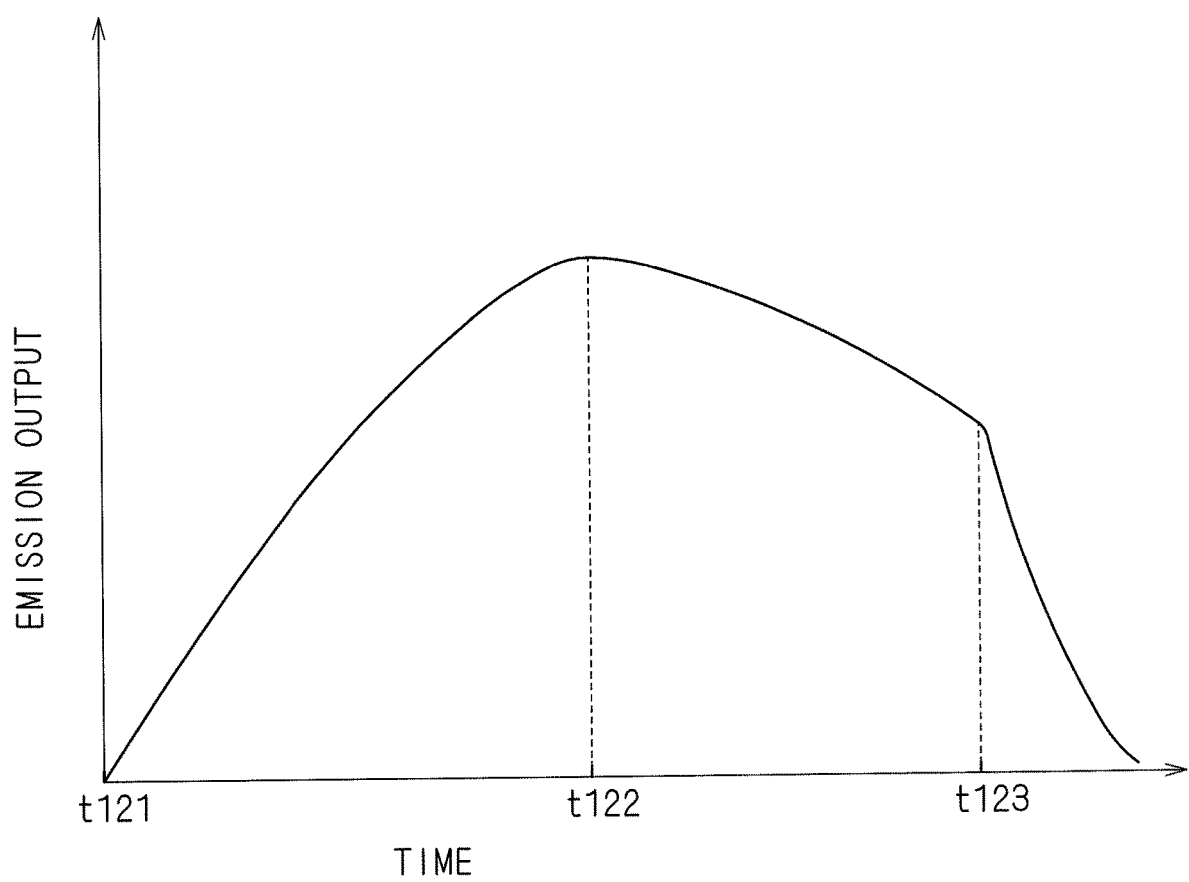
FIG. 17 is a graph showing another example of the emission output profile of the flash lamp.

The current having the waveform shown in the lower part of FIG. 16 flows, so that the flash lamp FL emits light. The emission output from the flash lamp FL is roughly proportional to the current flowing through the flash lamp FL. Thus, the output waveform (profile) of the emission output from the flash lamp FL has a pattern as shown in FIG. 17. Flash irradiation is performed on the front surface of the semiconductor wafer W held by the holder 7 in accordance with the output waveform from the flash lamp FL as shown in FIG. 17.

If the flash lamp FL emits light without using the IGBT 96, the electrical charges stored in the capacitor 93 are consumed momentarily by emitting light only once, so that the output waveform from the flash lamp FL exhibits a single pulse having a width on the order of 0.1 to 10 milliseconds. On the other hand, the IGBT 96 serving as a switching element is connected in the circuit and the pulse signal as shown in the upper part of FIG. 16 is outputted to the gate of the IGBT 96 according to the second preferred embodiment. Thus, the IGBT 96 intermittently supplies the electrical charges from the capacitor 93 to the flash lamp FL to control the current flowing to the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current reaches exactly zero, the next pulse is applied to the gate of the IGBT 96 to increase the current value again, as shown in FIG. 16. For this reason, the emission output never reaches exactly zero even while the flash lamp FL repeatedly flashes on and off.

As in the first preferred embodiment, the output waveform of light shown in FIG. 17 may be regarded to show that two-stage irradiation with light is performed. Specifically, the two-stage irradiation includes a first stage of irradiation (first irradiation) from time t121 at which the flash lamp FL starts emitting light to time t122 at which the emission output is at its maximum, and a second stage of irradiation (second irradiation) from the time t122 to time t123 during which the emission output decreases gradually.

More specifically, the pulse generator 31 first intermittently applies the pulses PA which are relatively long in pulse width and short in time intervals therebetween to the gate of the IGBT 96 to cause the IGBT 96 to repeatedly turn on and off, whereby a current flows through the circuit including the flash lamp FL. At this stage, because the pulses PA which are relatively long in pulse width and short in time intervals therebetween are applied to the gate of the IGBT 96, the ON time of the IGBT 96 is longer than the OFF time thereof, so that the current flowing through the flash lamp FL has a sawtooth waveform which increases as seen in general view (as shown in an early part of the lower part of FIG. 16). The flash lamp FL through which the current having such a waveform flows performs the first irradiation such that the emission output increases from the time t121 to the time t122.

Next, the pulse generator 31 intermittently applies the pulses PB which are relatively short in pulse width and long in time intervals therebetween to the gate of the IGBT 96. At this stage, because the pulses PB which are relatively short in pulse width and long in time intervals therebetween are applied to the gate of the IGBT 96, the ON time of the IGBT 96 is shorter than the OFF time thereof in a manner contrary to the above, so that the current flowing through the flash lamp FL has a sawtooth waveform which decreases gradually as seen in general view (as shown in a late part of the lower part of FIG. 16). The flash lamp FL through which the current having such a waveform flows performs the second irradiation such that the emission output decreases gradually from the time t122 to the time t123.

Figure 18:
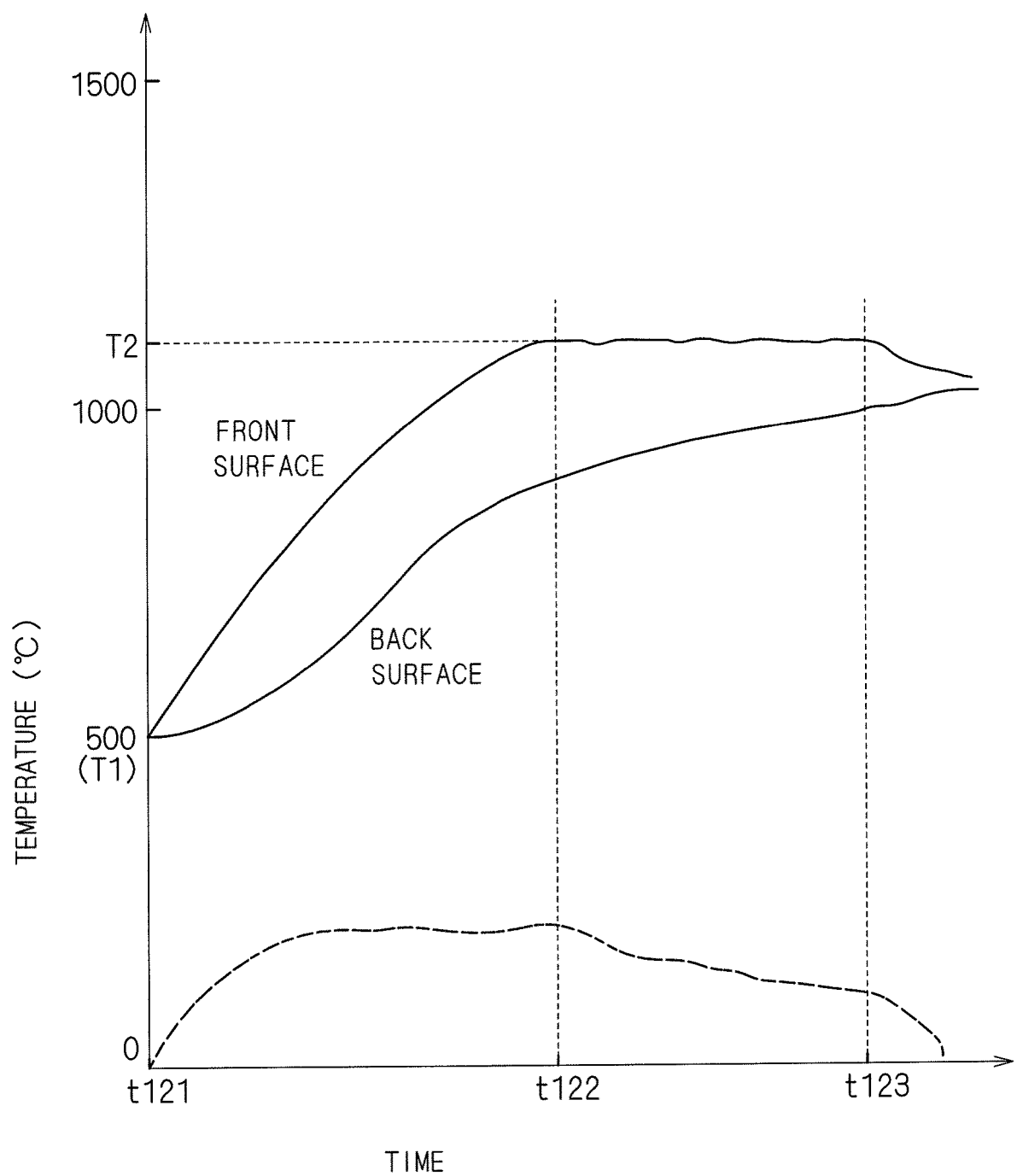
FIG. 18 is a graph showing an example of temperature profiles of the front and back surfaces of a semiconductor wafer.

By performing the two-stage irradiation with light as shown in FIG. 17 on the semiconductor wafer W, the temperature of the front surface of the semiconductor wafer W increases from the preheating temperature T1 to the target temperature T2. FIG. 18 is a graph showing an example of temperature profiles of the front and back surfaces of the semiconductor wafer W. In FIG. 18, the temperature profiles of the front and back surfaces are indicated by solid lines, and a profile of a temperature difference between the front and back surfaces is indicated by a broken line.

The first irradiation from the time t121 to the time t122 causes the temperature of the front surface of the semiconductor wafer W to increase from the preheating temperature T1 to the target temperature T2 (in Step S4). The target temperature T2 is in the range of 1000° to 1400° C. where the activation of the implanted impurities is achieved, and shall be 1100° C. in the second preferred embodiment.

The time period from the time t121 to the time t122 during which the temperature of the front surface of the semiconductor wafer W is increased from the preheating temperature T1 to the target temperature T2 by the first irradiation is longer than the time for heat conduction from the front surface of the semiconductor wafer W to the back surface thereof. The term "time for heat conduction" used herein refers to a time period required for heat generated at the front surface of the semiconductor wafer W by the flash irradiation to be conducted to the back surface thereof. The time for heat conduction is determined by the material and outer size of the semiconductor wafer W, and is approximately 15 milliseconds for a silicon wafer having a diameter of 300 mm (and having a standardized thickness of 0.775 mm) as used in this preferred embodiment. Specifically, the temperature of the front surface of the semiconductor wafer W is increased from the preheating temperature T1 to the target temperature T2 over a time period of not less than 15 milliseconds which is longer than the time required for heat conduction from the front surface to the back surface.

The rate of temperature increase (the rate of increase in temperature of the front surface) is not less than 1000° C./sec when the temperature of the front surface of the semiconductor wafer W is increased to the target temperature T2 by the first irradiation from the time t121 to the time t122. The IGBT 96 controls the passage of current to the flash lamp FL so that the emission output causes the rate of increase in the temperature of the front surface of the semiconductor wafer W to be not less than 1000° C./sec and causes the temperature of the front surface to increase from the preheating temperature T1 to the target temperature T2 over a time period longer than the time for heat conduction.

The second irradiation from the time t122 to the time t123, on the other hand, maintains the temperature of the front surface of the semiconductor wafer W within a ±25° C. range around the target temperature T2 (in Step S5). The time period from the time t122 to the time t123 during which the temperature of the front surface of the semiconductor wafer W is maintained within a ±25° C. range around the target temperature T2 is not less than five milliseconds. The IGBT 96 controls the passage of current to the flash lamp FL so that the emission output causes the temperature of the front surface of the semiconductor wafer W to be maintained within a ±25° C. range around the target temperature T2 for not less than five milliseconds. It should be noted that the graph of FIG. 15 is plotted with a time scale of seconds, whereas the graph of FIG. 18 is plotted with a time scale of milliseconds. Thus, the times t121 to t123 in FIG. 18 are shown as overlaid on the time t2 in FIG. 15.

In the course of the first irradiation and the second irradiation, the heat generated at the front surface of the semiconductor wafer W is conducted to the back surface thereof, so that the temperature of the back surface also increases gradually. As indicated by the broken line in FIG. 18, the temperature difference between the front and back surfaces of the semiconductor wafer W is always not more than one-half of a jump temperature by which the temperature of the front surface of the semiconductor wafer W is increased by the first irradiation. The jump temperature refers to the amount of temperature increased by the first irradiation, that is, a temperature difference between the target temperature T2 and the preheating temperature T1, and is 600° C. in the second preferred embodiment.

After the second irradiation using the flash lamp FL is completed, the IGBT 96 turns off to stop the light emission from the flash lamp FL (in Step S6). Then, the temperature of the front surface of the semiconductor wafer W decreases from the target temperature T2. At this time, the temperature of the front surface of the semiconductor wafer W becomes equal to that of the back surface thereof. Referring again to FIG. 15, the halogen lamps HL turn off at the time t3 which is a predetermined time period later than the completion of the second irradiation (in Step S7). This causes the temperature of the semiconductor wafer W to start decreasing from the preheating temperature T1. At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the opening 78 of the susceptor 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held by the susceptor 74 without being influenced by disturbance light.

The controller 3 monitors whether the temperature of the semiconductor wafer W measured with the radiation thermometer 120 decreases to a predetermined temperature or not. After the temperature of the semiconductor wafer W decreases to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

In the second preferred embodiment, the pulses PA which are relatively long in pulse width and short in time intervals therebetween are intermittently applied to the gate of the IGBT 96 to perform the first irradiation which increases the emission output from the flash lamp FL from zero to a maximum value. Such first irradiation causes the temperature of the front surface of the semiconductor wafer W to increase from the preheating temperature T1 to the target temperature T2 (in this preferred embodiment, to increase by 600° C. as the jump temperature). At this time, the temperature of the front surface of the semiconductor wafer W is increased from the preheating temperature T1 to the target temperature T2 over a time period longer than the time required for heat conduction from the front surface of the semiconductor wafer W to the back surface thereof.

Next, after the temperature of the front surface of the semiconductor wafer W is increased from the preheating temperature T1 to the target temperature T2, the pulses PB which are relatively short in pulse width and long in time intervals therebetween are intermittently applied to the gate of the IGBT 96 to perform the second irradiation which gradually decreases the emission output from the flash lamp FL from the maximum value. Such second irradiation maintains the temperature of the front surface of the semiconductor wafer W within a ±25° C. range around the target temperature T2 for not less than five milliseconds.

The time required for the activation of the implanted impurities is extremely short, and the activation of the impurities is achieved by the first irradiation which increases the temperature of the front surface of the semiconductor wafer W to the target temperature T2. Also, recovery of point defects induced in the semiconductor wafer W during the implantation of the impurities is achieved by maintaining the temperature of the front surface of the semiconductor wafer W near the target temperature T2 for not less than five milliseconds.

Further, in the second preferred embodiment in which the temperature of the front surface of the semiconductor wafer W is increased from the preheating temperature T1 to the target temperature T2 over a time period longer than the time required for heat conduction from the front surface of the semiconductor wafer W to the back surface thereof, the temperature difference between the front and back surfaces of the semiconductor wafer W is always not more than one-half of the jump temperature (in the second preferred embodiment, not more than 300° C.). This alleviates the concentration of stresses on the back surface of the semiconductor wafer W resulting from a difference in thermal expansion between the front and back surfaces to consequently prevent the cracking of the semiconductor wafer W during the flash heating.

Modifications

While the preferred embodiments according to the present invention have been described hereinabove, various modifications of the present invention in addition to those described above may be made without departing from the scope and spirit of the invention. For example, in the first preferred embodiment described above, the temperature of the front surface of the semiconductor wafer W is increased from the preheating temperature T1 to the target temperature T2 by the first irradiation, and is then maintained near the target temperature T2 by the second irradiation subsequent to the first irradiation. However, the temperature maintained by the second irradiation is not limited to the target temperature T2. As an example, when the temperature of the front surface of the semiconductor wafer W, after reaching the target temperature T2, is decreased by 50° to 200° C. from the target temperature T2, the second irradiation may be started to maintain the temperature of the front surface of the semiconductor wafer W within a ±25° C. range around the decreased temperature (a second target temperature).

Although the heat treatment is performed by irradiating the front surface of the semiconductor wafer W with a flash of light in the second preferred embodiment, the back surface of the semiconductor wafer W may be irradiated with a flash of light. Specifically, after the semiconductor wafer W is inverted or flipped upside down and then held by the holder 7 (i.e., held, with the front surface positioned to face downward), the treatment similar to that described in the aforementioned second preferred embodiment may be performed. Also, the heat treatment apparatus may be configured such that the halogen heating part 4 is disposed over the chamber 6 whereas the flash heating part 5 is disposed under the chamber 6, and perform the flash heating treatment. Even when the flash irradiation is performed on the back surface of the semiconductor wafer W in the second preferred embodiment, the temperature difference between the front and back surfaces of the semiconductor wafer W is caused to be always not more than one-half of the jump temperature by increasing the temperature of the back surface from the preheating temperature T1 to the target temperature T2 over a time period longer than the time required for heat conduction from the back surface of the semiconductor wafer W to the front surface thereof. As a result, this alleviates the concentration of stresses on the front surface of the semiconductor wafer W resulting from a difference in thermal expansion between the front and back surfaces during the flash heating to prevent the cracking of the semiconductor wafer W.

After all, it is only required to irradiate a first surface of the semiconductor wafer W with a flash of light from the flash lamps FL, thereby increasing the temperature of the first surface from the preheating temperature T1 to the target temperature T2 over a time period longer than the time required for heat conduction from the first surface to a second surface of the semiconductor wafer W which is a main surface opposite from the first surface. After the temperature is increased, the first surface of the semiconductor wafer W is irradiated with a flash of light, so that the temperature of the first surface is maintained within a ±25° C. range around the target temperature T2 for not less than five milliseconds. This causes the temperature difference between the front and back surfaces of the semiconductor wafer W at the time of the flash heating is caused to be always not more than one-half of the jump temperature. This alleviates the concentration of stresses on the first surface (or the second surface) of the semiconductor wafer W resulting from a difference in thermal expansion between the front and back surfaces to prevent the cracking of the semiconductor wafer W.

Also, the process for setting the waveform of the pulse signal is not limited to inputting the parameters including the pulse width and the like one by one from the input part 33. For example, the setting of the waveform may be done by an operator inputting the waveform directly in graphical form from the input part 33, by reading the waveform previously set and stored in a storage part such as a magnetic disk and the like, or by downloading the waveform from outside the heat treatment apparatus 1.

Further, although the voltage is applied to the trigger electrode 91 in synchronism with the turning on of the pulse signal in the aforementioned preferred embodiments, the timing of the application of the trigger voltage is not limited to this. The trigger voltage may be applied at fixed time intervals independently of the waveform of the pulse signal. In a case where the pulse signal is short in time intervals or where the passage of current is started by a pulse while the value of the current caused to flow through the flash lamp FL by the preceding pulse is not less than a predetermined value, the current continues to flow through the flash lamp FL without interruption. In such a case, it is not necessary to apply the trigger voltage for each pulse. In a case where all of the pulse intervals of the pulse signal are shorter than a predetermined value as shown in the upper part of FIG. 12 according to the first preferred embodiment, the trigger voltage may be applied only when the first pulse is applied. Thereafter, the current waveform as shown in the lower part of FIG. 12 is provided only by outputting the pulse signal as shown in the upper part of FIG. 12 to the gate of the IGBT 96 without the application of the trigger voltage. In other words, the timing of the application of the trigger voltage may be arbitrarily determined as long as the timing of the current flow through the flash lamp FL coincides with the turning on of the pulse signal.

Although the IGBT 96 is used as a switching element in the aforementioned preferred embodiments, another transistor capable of turning on and off the circuit in accordance with the signal level inputted to the gate thereof may be used in place of the IGBT 96. It is, however, preferable to use an IGBT and a GTO (gate turn-off) thyristor which are suitable for handling high power as a switching element because the emission of light from the flash lamps FL consumes considerably high power.

Also, a circuit configuration different from that shown in FIG. 8 may be employed as long as multi-stage irradiation with light from the flash lamp FL is achieved. For example, a plurality of power supply circuits having different coil constants may be connected to a single flash lamp FL. Also, as long as the multi-stage irradiation with light is achieved, the light source is not limited to the flash lamp FL, but is required only to be capable of emitting light for not more than one second. As an example, a laser may be used as the light source.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned preferred embodiments, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Although the heat treatment is performed by the irradiation with light from the flash lamps FL, to thereby activate the impurities in the aforementioned preferred embodiments, the heat treatment technique according to the present invention is applicable to other treatments and processing. For example, silicide technology is known which forms an alloy of high-melting-point metal and silicon to enhance the characteristics of a MOSFET. In particular, attention is being given to nickel silicide technology which uses nickel (Ni). A problem with the nickel silicide technology has been pointed out in that nickel silicide grows abnormally in a horizontal direction (in the direction of the gate) in an alloying process to break through a source/drain junction, thereby increasing a leakage current abruptly.

To prevent such a problem, a technique has been used which introduces nitrogen ($N_2$), argon (Ar), silicon (Si), germanium (Ge) and the like into the silicon substrate 111 to make the silicon substrate 111 amorphous, thereby causing the nickel silicide to grow only in a vertical direction. In the introducing step, however, defects occur at an interface between an amorphous layer and a crystalline layer of silicon. When the heat treatment technique according to the present invention is applied to the semiconductor wafer W with the nickel silicide formed therein, the temperature of the front surface of the semiconductor wafer W is maintained near the target temperature for a predetermined time period. This alleviates the defects induced during the introducing step while preventing the horizontal growth of the nickel silicide.

For this heat treatment, the preheating temperature T1 is not more than 300° C., and the target temperature T2 is in the range of 600° to 1100° C. Also, the time period for the first irradiation during which the emission output from the flash lamp FL increases from zero to the maximum value is in the range of 1 to 20 milliseconds, and the time period for the second irradiation during which the emission output from the flash lamp FL is gradually decreased from the maximum value is in the range of 1 to 100 milliseconds.

For the heat treatment of the semiconductor wafer W provided with a gate electrode containing at least one metal selected from the group consisting of titanium (Ti), zirconium (Zr), hafnium (Hf), vanadium (V), niobium (Nb), tantalum (Ta), molybdenum (Mo) and tungsten (W), and provided with a film (a high-k film) made of, for example, TiN, ZrN, HfN, VN, NbN, TaN, MoN, WN, TiSiN, HfSiN, VSiN, NbSiN, TaSiN, MoSiN, WSiN, HfAlN, VAlN, NbAlN, TaAlN, MoAlN and WAlN, it has been difficult for conventional spike annealing to provide desired characteristics because of the high diffusion coefficient of the material used therefor. For this reason, flash lamp annealing is suitable which is capable of increasing the temperature in an extremely shorter time than the spike annealing. However, if the temperature is increased and decreased too abruptly, electron traps are created in crystals. The application of the heat treatment technique according to the present invention to the semiconductor wafer W provided with the high-k film allows the temperature of the front surface of the semiconductor wafer W to be maintained near the target temperature for a predetermined time period, thereby providing desired crystallinity while preventing the creation of electron traps.

For this heat treatment, the preheating temperature T1 is not more than 900° C., and the target temperature T2 is in the range of 1000° to 1200° C. in consideration for an instance of a structure such that stresses are applied to the source/drain made of a material such as SiGe. Also, the time period for the first irradiation during which the emission output from the flash lamp FL increases from zero to the maximum value is in the range of three milliseconds to one second, and the time period for the second irradiation during which the emission output from the flash lamp FL is gradually decreased from the maximum value is in the range of three milliseconds to one second.

Also, a substrate to be treated according to the second preferred embodiment is not limited to a semiconductor wafer of silicon having a diameter of 300 mm, but may be a semiconductor wafer having a diameter of, for example, 200 mm or 450 mm. Semiconductor wafers having different diameters have different thicknesses based on standards, and accordingly differ in the time required for heat conduction from a first wafer surface to a second wafer surface. Even in such a case, the increase in the temperature of the first wafer surface from the preheating temperature T1 to the target temperature T2 over a time period longer than the time required for heat conduction from the first wafer surface to the second wafer surface alleviates the concentration of stresses on the first wafer surface (or the second wafer surface) resulting from a difference in thermal expansion between the front and back surfaces to prevent the cracking of the semiconductor wafer.

Further, a substrate to be treated according to the second preferred embodiment may be a semiconductor wafer of silicon having a front surface with a resist film formed thereon. When the resist film is formed on the front surface of the semiconductor wafer, a PEB (post-exposure bake) process and a PAB (post-applied bake) process may be performed by the flash irradiation. Since the target temperature required for these heat treatments is relatively low (100° to 200° C.), it is preferable to perform the flash irradiation on the back surface of the semiconductor wafer with the resist film formed thereon.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A heat treatment method for heating a silicon substrate to grow a silicide, the method comprising the steps of:
   (a) preheating a silicon substrate on which nickel is formed on an amorphous layer of silicon at a predetermined preheating temperature;
   (b) irradiating said silicon substrate with light from a flash lamp and increasing a temperature of a front surface of said silicon substrate from said preheating temperature to a maximum reached temperature over a time period in the range of 1 to 20 milliseconds, wherein said maximum reached temperature is not exceeded during performance of said heat treatment; and
   (c) after said step (b), irradiating said silicon substrate with light from said flash lamp and maintaining a temperature of a front surface of said silicon substrate within a ±25° C. range around said maximum reached temperature during a period of 3 to 50 milliseconds.

2. The heat treatment method according to claim 1, wherein
   an emission output from said flash lamp is gradually decreased in said step (c).

3. The heat treatment method according to claim 1, wherein
   said preheating temperature is equal to or less than 300° C.

4. The heat treatment method according to claim 3, wherein
   said maximum reached temperature is equal to or greater than 600° C. and equal to or less than 1100° C.

5. The heat treatment method according to claim 1, wherein
   nitrogen, argon, silicon or germanium is implanted into said silicon substrate to form said amorphous layer.

6. A heat treatment method for heating a substrate on which a high-k film is formed, the method comprising the steps of:
   (a) preheating a substrate on which a high-k film and a metal gate electrode are formed at a predetermined preheating temperature;

(b) irradiating said substrate with light from a flash lamp and increasing a temperature of a front surface of said substrate from said preheating temperature to a maximum reached temperature over a time period in the range of 1 to 20 milliseconds, wherein said maximum reached temperature is not exceeded during performance of said heat treatment; and (c) after said step (b), irradiating said substrate with light from said flash lamp and maintaining a temperature of a front surface of said substrate within a ±25° C. range around said maximum reached temperature during a period of 3 to 50 milliseconds.

7. The heat treatment method according to claim 6, wherein
an emission output from said flash lamp is gradually decreased in said step (c).

8. The heat treatment method according to claim 6, wherein
said preheating temperature is equal to or less than 900° C.

9. The heat treatment method according to claim 8, wherein
said maximum reached temperature is equal to or greater than 1000° C. and equal to or less than 1200° C.

10. The heat treatment method according to claim 6, wherein
said high-k film is formed of one material selected from a group consisting of TiN, ZrN, HfN, VN, NbN, TaN, MoN, WN, TiSiN, HfSiN, VSiN, NbSiN, TaSiN, MoSiN, WSiN, HfAlN, VAlN, NbAlN, TaAlN, MoAlN and WAlN.

11. The heat treatment method according to claim 10, wherein
said gate electrode includes one or more metals selected from a group consisting of Ti, Zr, Hf, V, Nb, Ta, Mo and W.

* * * * *